US012812879B2

(12) United States Patent
Tsui

(10) Patent No.: US 12,812,879 B2
(45) Date of Patent: Nov. 24, 2026

(54) CAPACITOR HAVING CONDUCTIVE PILLAR STRUCTURES CONFIGURED TO INCREASE CAPACITANCE DENSITY

(71) Applicant: Taiwan Semiconductor Manufacturing Company, Ltd., Hsinchu (TW)

(72) Inventor: Yingkit Felix Tsui, Cupertino, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 610 days.

(21) Appl. No.: 18/330,531

(22) Filed: Jun. 7, 2023

(65) Prior Publication Data

US 2024/0304662 A1 Sep. 12, 2024

Related U.S. Application Data

(60) Provisional application No. 63/488,983, filed on Mar. 8, 2023.

(51) Int. Cl.
*H10D 1/00* (2025.01)
*H10D 1/68* (2025.01)
*H10W 20/40* (2026.01)

(52) U.S. Cl.
CPC ............. *H10D 1/042* (2025.01); *H10D 1/714* (2025.01); *H10D 1/716* (2025.01); *H10W 20/496* (2026.01)

(58) Field of Classification Search
CPC .... H10B 12/033; H10B 12/315; H10D 1/714; H10D 1/716; H10D 1/042; H10W 20/496
See application file for complete search history.

(56) References Cited

U.S. PATENT DOCUMENTS

| | | | | |
|---|---|---|---|---|
| 11,031,457 | B2 * | 6/2021 | Li .......................... | H10D 1/042 |
| 2015/0364538 | A1 | 12/2015 | Wang et al. | |
| 2020/0203357 | A1 | 6/2020 | Chhajed et al. | |
| 2021/0005381 | A1 | 1/2021 | Lu et al. | |
| 2021/0005393 | A1 | 1/2021 | Lu et al. | |
| 2021/0005705 | A1 | 1/2021 | Lu et al. | |
| 2021/0202485 | A1 | 7/2021 | Inaba | |
| 2021/0202761 | A1 | 7/2021 | Cheng et al. | |
| 2021/0296283 | A1 | 9/2021 | Huang et al. | |
| 2023/0024307 | A1 | 1/2023 | Lee et al. | |
| 2023/0069774 | A1 | 3/2023 | Chang et al. | |

* cited by examiner

*Primary Examiner* — Jose R Diaz
(74) *Attorney, Agent, or Firm* — Eschweiler & Potashnik, LLC

(57) ABSTRACT

Various embodiments of the present disclosure are directed towards an integrated chip including a conductive base layer overlying a semiconductor substrate. A plurality of conductive pillar structures vertically extending from the conductive base layer in a direction away from the semiconductor substrate. The conductive pillar structures are laterally offset from one another. A plurality of conductive layers and a plurality of capacitor dielectric layers are disposed over the conductive pillar structures. The conductive layers and the capacitor dielectric layers are stacked alternatingly with one another. The conductive layers and the capacitor dielectric layers laterally wrap around outer perimeters of the conductive pillar structures.

20 Claims, 21 Drawing Sheets

1500

1600a

CAPACITOR HAVING CONDUCTIVE PILLAR STRUCTURES CONFIGURED TO INCREASE CAPACITANCE DENSITY

REFERENCE TO RELATED APPLICATION

This application claims the benefit of U.S. Provisional Application No. 63/488,983, filed on Mar. 8, 2023, the contents of which are hereby incorporated by reference in their entirety.

BACKGROUND

Integrated chips comprise a plurality of electronic devices disposed on and/or over a semiconductor substrate. The electronic devices may include active devices, such as transistors configured to act as switches and/or to produce power gains as to enable logical functionality. The electronic devices further include passive devices used to control gains, time constants, and other integrated chip characteristics. One type of passive devices is a capacitor, such as a metal-insulator-metal (MIM) capacitor, metal-oxide-metal (MoM) capacitor, a trench capacitor, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
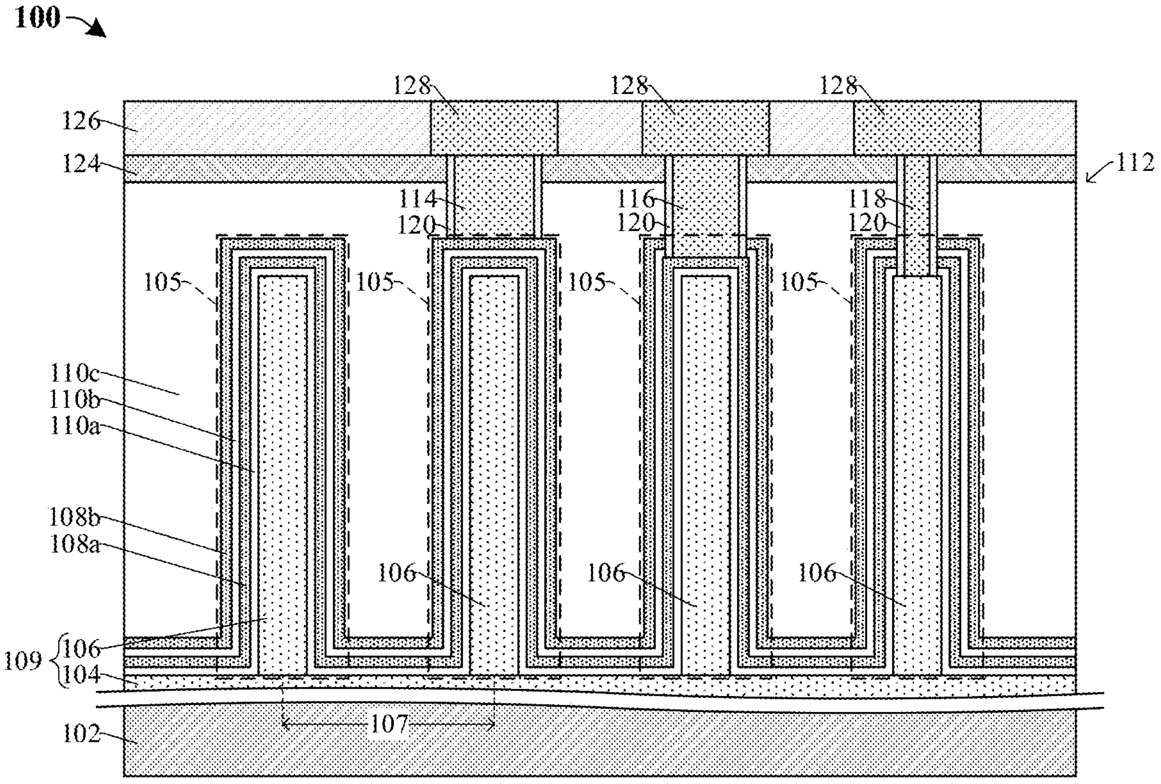
FIG. 1 illustrates a cross-sectional view of some embodiments of an integrated chip having a capacitor comprising a plurality of conductive pillar structures vertically extending from a conductive base layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of electronic devices such as a trench capacitor disposed within and/or a semiconductor substrate. The semiconductor substrate may include sidewalls that define a plurality of trenches extending into the semiconductor substrate. The semiconductor substrate further includes one or more fin structures extending vertically from an upper surface of the semiconductor substrate that laterally separate adjacent trenches from one another. The trench capacitor includes multiple conductive layers and one or more dielectric layers. The conductive layers and the dielectric layer(s) are alternatingly stacked in the plurality of trenches, thereby defining capacitor trench segments in the plurality of trenches. The capacitor trench segments conform to surfaces of the semiconductor substrate defining the trenches and are separated from one another by an individual fin structure of the semiconductor substrate. A capacitance density of the trench capacitor may be increased by increasing the number of capacitor trench segments and/or by increasing a height of the capacitor trench segments. This is because a surface area between adjacent conductive layers is increased as the height of the capacitor trench segments increases and/or the number of capacitor trench segments increases.

In an effort to increase the number of capacitor trench segments, a trench pitch (e.g., a lateral distance between center points of neighboring capacitor trench segments) of the capacitor trench segments may be decreased. The trench pitch may be reducing by decreasing widths of the fin structure (i.e., decreasing a distance between the capacitor trench segments). However, as the widths of the fin structures decrease the fin structures are more likely to crack and/or break, thereby reducing a structural integrity of the trench capacitor. For example, due to a material (e.g., silicon) and relatively low width of the fin structures, one or more fin structures may collapse or break and may result in cracking and/or delamination in layers of the trench capacitor. This may result in device breakdown and/or decrease a reliability and/or endurance of the trench capacitor. As a result, reduction of the trench pitch may be limited, thereby limiting an increase of the capacitance density of the trench capacitor.

Accordingly, various embodiments of the present disclosure are directed towards an integrated chip comprising a capacitor having a high capacitance density and high structural integrity, and an associated method of fabrication. The capacitor includes a conductive base layer overlying a semiconductor substrate. A plurality of conductive pillar structures vertically extend from the conductive base layer in a directly away from the substrate, where the conductive pillar structures are laterally offset from one another. The plurality of conductive pillar structures and the conductive base layer comprise a first conductive material (e.g., tungsten). Further, a plurality of conductive layers and a plurality of capacitor dielectric layers are stacked alternatingly with one another over the conductive pillar structures. The conductive layers and the capacitor dielectric layers laterally wrap around outer perimeters of the pillar structures. By virtue of a layout of the plurality of conductive pillar structures and the conductive pillar structures comprising the first conductive material, a pillar pitch (e.g., a lateral distance between center points of neighboring conductive pillar structures) of the conductive pillar structures may be decreased while maintaining or increasing a structural integrity of the capacitor. For example, due to the plurality of conductive pillar structures comprising the first conductive material, the conductive pillar structures are less likely to crack and/or break as widths of the conductive pillar structures are decreased. Accordingly, the pillar pitch may be sufficiently reduced while mitigating cracking and/or delamination of layers and/or structures of the capacitor. Thus, the capacitance density of the capacitor may be increased while maintaining or increasing a reliability and/or an endurance of the capacitor.

FIG. 1 illustrates a cross-sectional view 100 of some embodiments of an integrated chip having a capacitor 112 comprising a plurality of conductive pillar structures 106 vertically extending from a conductive base layer 104.

The capacitor 112 overlies a semiconductor substrate 102. In some embodiments, the capacitor 112 comprises a first electrode structure 109, a plurality of conductive layers 108*a-b*, and a plurality of capacitor dielectric layers 110*a-c*. The first electrode structure 109 includes a conductive base layer 104 and a plurality of conductive pillars structures 106 vertically extending from the conductive base layer 104 in a direction away from the semiconductor substrate 102. The capacitor 112 has capacitor column segments 105 laterally spaced from one another. In various embodiments, an individual conductive pillar structure 106 is spaced at a center of each capacitor column segment 105. Further, the plurality of conductive layers 108*a-b* laterally enclose outer perimeters of the conductive pillar structures 106 and are disposed over top surfaces of the conductive pillar structures 106 in the capacitor column segments 105. The plurality of conductive layers 108*a-b* are spaced between adjacent capacitor dielectric layers in the plurality of capacitor dielectric layers 110*a-c*. The plurality of conductive layers 108*a-b* comprise a first conductive layer 108*a* and a second conductive layer 108*b*. The plurality of capacitor dielectric layers 110*a-c* comprise a first capacitor dielectric layer 110*a*, a second capacitor dielectric layer 110*b*, and a third capacitor dielectric layer 110*c*.

A capping layer 124 overlies the capacitor 112. An upper dielectric layer 126 is disposed on the capping layer 124. A plurality of conductive contacts 114-118 extend through the capping layer 124 and one or more of the capacitor dielectric layers 110*a-c* to contact a corresponding conductive layer in the plurality of conductive layers 108*a-b* or a corresponding conductive pillar structures in the plurality of conductive pillar structures 106. The plurality of conductive contacts 114-118 comprises a first conductive contact 114, a second conductive contact 116, and a third conductive contact 118. In some embodiments, the first conductive contact 114 is directly electrically coupled to the second conductive layer 108*b*, the second conductive contact 116 is directly electrically coupled to the first conductive layer 108*a*, and the third conductive contact 118 is directly electrically coupled to the plurality of conductive pillar structures 106. A plurality of conductive wires 128 are disposed within the upper dielectric layer 126 over the plurality of conductive contacts 114-118. The plurality of conductive wires 128 are electrically coupled to the capacitor 112 by way of the plurality of conductive contacts 114-118. Further, sidewall spacer structures 120 are disposed along sidewalls of the conductive contacts 114-118.

The plurality of conductive pillar structures 106 comprise a first conductive material (e.g., tungsten). Further, the conductive layers 108*a-b* and the capacitor dielectric layers 110*a-c* laterally wrap around outer perimeters of the conductive pillar structures. By virtue of a layout of the conductive pillar structures 106 and the conductive pillar structures 106 comprising the first conductive material (e.g., tungsten), a pillar pitch 107 (e.g., a lateral distance between center points of neighboring conductive pillar structures 106) may be decreased while maintaining or increasing a structural integrity of the capacitor 112. For example, due to the conductive pillar structures 106 comprising the first conductive material (e.g., tungsten), the conductive pillar structures 106 are less likely to crack and/or break as widths of the conductive pillar structures 106 are decreased. Accordingly, the pillar pitch 107 may be sufficiently reduced while mitigating cracking and/or delamination of layers and/or structures of the capacitor 112. As a result, a number of conductive pillar structures 106 in the capacitor 112 disposed over a first area of the semiconductor substrate 102 may, for example, be greater than a number of capacitor trench segments in a trench capacitor disposed over the same first area. Thus, a capacitance density of the capacitor 112 may be increased while maintaining or increasing a reliability and/or endurance of the capacitor 112.

Figure 2A:
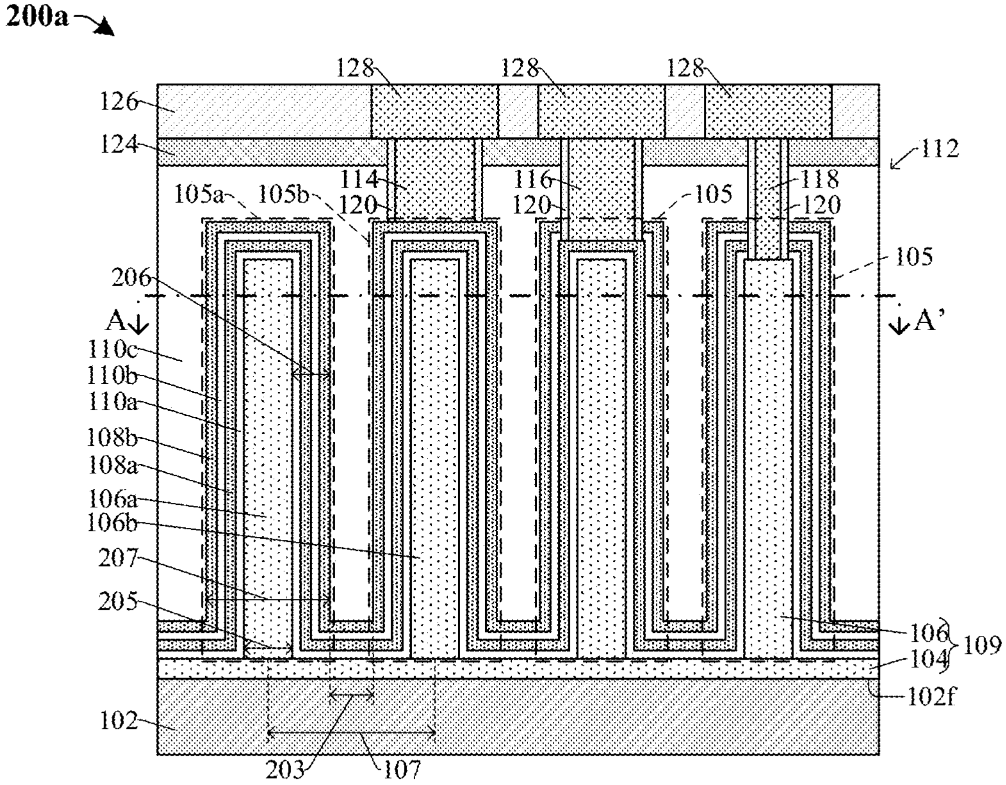
FIGS. 2A-2C illustrate various views of some other embodiments of the integrated chip of FIG. 1.
Figure 2B:
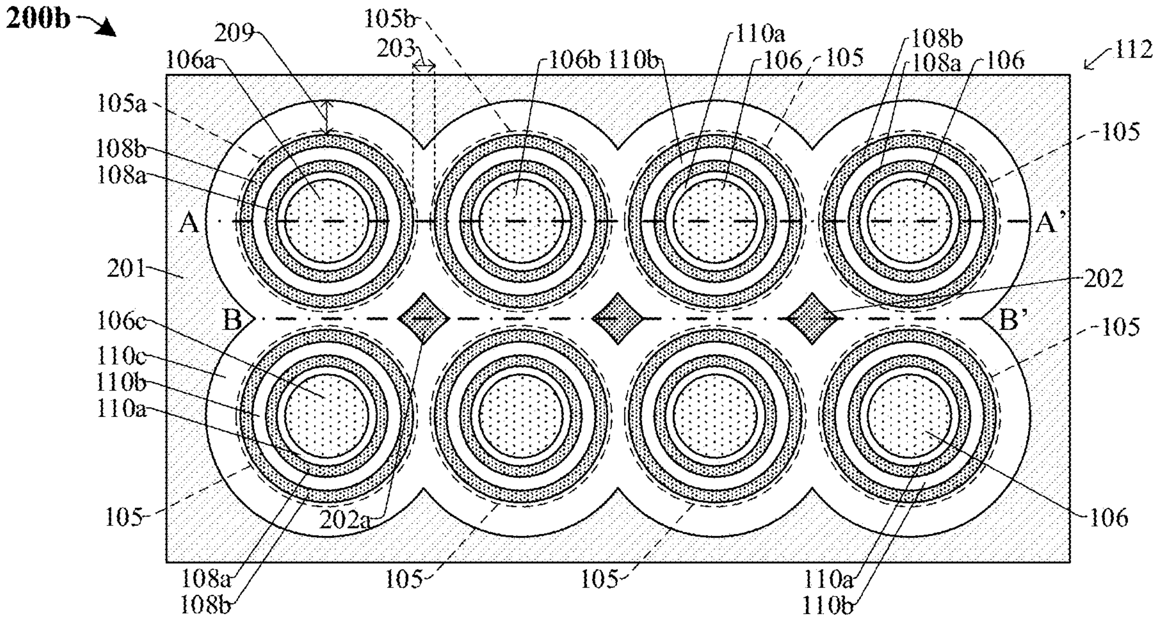
Figure 2C:
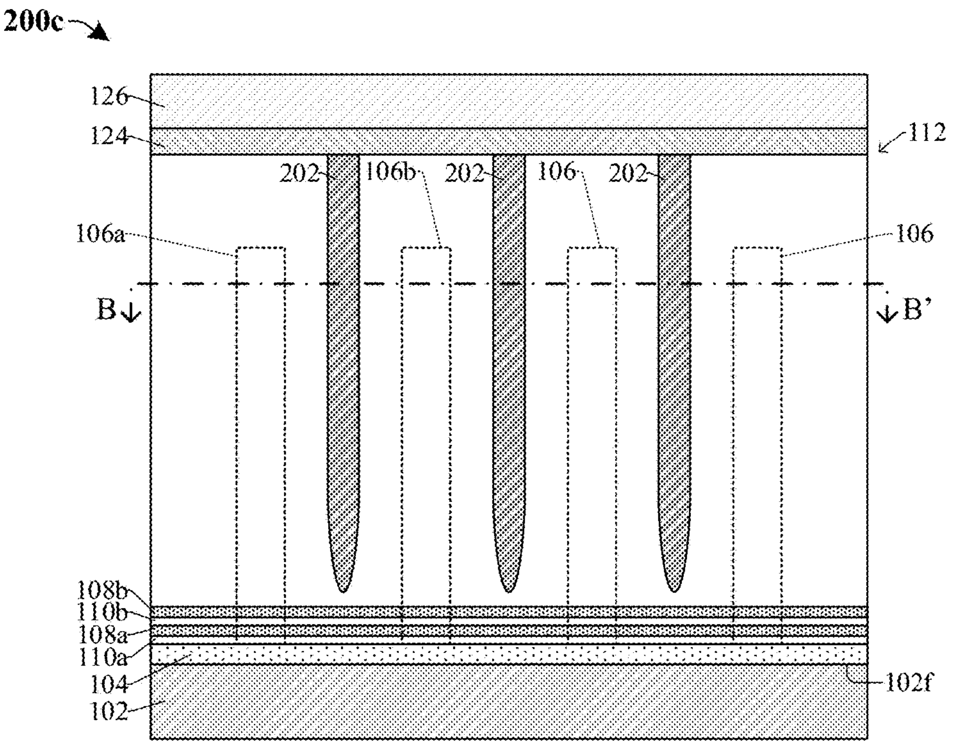

FIGS. 2A-2C illustrate various views of some other embodiments of the integrated chip of FIG. 1. FIG. 2A illustrates a cross-sectional view 200*a* of some embodiments of the integrated chip taken along line A-A' of FIG. 2B. FIG. 2B illustrates a top view 200*b* of some embodiments of the integrated chip. FIG. 2C illustrates a cross-sectional view 200*c* of some embodiments of the integrated chip taken along line B-B' of FIG. 2B.

As shown in FIG. 2A, the integrated chip comprises a capacitor 112 overlying a front-side surface 102*f* of a semiconductor substrate 102. The semiconductor substrate 102 may, for example, be or comprise silicon, monocrystalline silicon, a bulk substrate, a silicon-on-insulator (SOI) substrate, or the like. In some embodiments, the capacitor 112 comprises a first electrode structure 109, a plurality of conductive layers 108*a-b*, and a plurality of capacitor dielectric layers 110*a-c*. The first electrode structures 109 comprises the conductive base layer 104 and a plurality of conductive pillar structures 106 disposed on a top surface of the conductive base layer 104. The plurality of conductive pillar structures 106 directly contact the top surface of the conductive base layer 104 and are directly electrically coupled to the conductive base layer 104. In various embodiments, the conductive base layer 104 is configured as a seed layer that facilitates growth of the plurality of conductive pillar structures 106. In such instances, the conductive base layer 104 facilitates the conductive pillar structures 106 being formed and/or grown with reduced imperfections, such that the conductive pillar structures 106 have a high crystalline quality. The plurality of conductive pillar structures 106 and the conductive base layer 104 comprise a first conductive material. The first conductive material may, for example, be or comprise tungsten or some other suitable material. In some embodiments, the conductive base layer 104 has a thickness of about 500 angstroms, within a range of about 400 to 600 angstroms, or some other suitable value.

The plurality of capacitor dielectric layers 110*a-c* and the plurality of conductive layers 108*a-b* overlie top surfaces of the conductive pillar structures 106 and conform to sidewalls of the conductive pillar structures 106. In various embodiments, the capacitor dielectric layers 110*a-c* and the conductive layers 108*a-b* respectively laterally enclose an outer perimeter of each of the conductive pillar structures 106. In some embodiments, the plurality of capacitor dielectric layers 110*a-c* are alternatingly stacked between the first electrode structure 109 and the plurality of conductive layers 108*a-b*. The plurality of conductive layers 108*a-b* include a first conductive layer 108*a* and a second conductive layer 108*b*. The plurality of capacitor dielectric layers 110*a-c* include a first capacitor dielectric layer 110*a*, a second capacitor dielectric layer 110*b*, and a third capacitor dielectric layer 110*c*. The first capacitor dielectric layer 110*a* is disposed between the first electrode structure 109 and the first conductive layer 108*a*. The second capacitor dielectric layer 110*b* is disposed between the first conductive layer 108*a* and the second conductive layer 108*b*. Further, the third capacitor dielectric layer 110*c* overlies a top surface of the second conductive layer 108*b* and extends along sidewalls of the second conductive layer 108*b*.

The plurality of conductive layers 108*a-b* comprise a second conductive material. In some embodiments, the second conductive material may, for example, be or comprise titanium nitride, tantalum nitride, another conductive material, or the like. In various embodiments, the second conductive material is different from the first conductive material. In further embodiments, the conductive layers 108*a-b* respectively have a thickness within a range of about 150 to 200 angstroms or some other suitable value. The plurality of capacitor dielectric layers 110*a-c* may, for example, respectively be or comprise a high-k dielectric material, such as hafnium oxide, zirconium oxide, aluminum oxide, tantalum oxide, titanium oxide, some other suitable dielectric material, or any combination of the foregoing. In various embodiments, the capacitor dielectric layers 110*a-c* respectively have a thickness within a range of about 40 to 90 angstroms or some other suitable value. In further embodiments, a thickness of the third capacitor dielectric layer 110*c* is greater than thickness of the first and second capacitor dielectric layers 110*a*, 110*b*. In yet further embodiments, the thickness of the third capacitor dielectric layer 110*c* is greater than thickness of the first and/or second conductive layers 108*a*, 108*b*.

The capacitor has capacitor column segments 105 laterally spaced apart from one another. The capacitor column segments 105 vertically extend from the top surface of the conductive base layer 104 in a direction away from the semiconductor substrate 102. The capacitor column segments 105 respectively comprise portions of the conductive layers 108*a-b* and portions of the first and second capacitor dielectric layers 110*a*, 110*b* laterally enclosing an individual conductive pillar structures in the plurality of conductive pillar structures 106. Center points of neighboring conductive pillar structures 106 are laterally spaced from one another by a pillar pitch 107. By virtue of a layout, shape, and/or material of the conductive pillar structures 106 the pillar pitch 107 may be decreased, thereby increasing a number of capacitor column segments 105 that may be disposed within a first area over the semiconductor substrate 102. As a result, a capacitance density of the capacitor 112 may be increased. Further, the conductive pillar structures 106 comprising the first conductive material (e.g., tungsten) and being formed over the conductive base layer 104 with the high crystalline quality mitigates cracking and/or breaks in the conductive pillar structures 106. Thus, the capacitor 112 comprising the conductive pillar structures 106 increases the capacitance density, reliability, and endurance of the capacitor 112.

The plurality of capacitor column segments 105 comprise a first capacitor column segment 105*a* directly laterally adjacent to a second capacitor column segment 105*b*. The first capacitor column segment 105*a* includes a first conductive pillar structure 106*a* and the second capacitor column segment 105*b* includes a second conductive pillar structure 106*b*. The first capacitor column segment 105*a* is laterally separated from the second capacitor column segment 105*b* by a lateral distance 203. In various embodiments, the lateral distance 203 is less than half of a width 207 of the first capacitor column segment 105*a*. In yet further embodiments, the lateral distance 203 is less than a thickness 206 of the first and second conductive layers 108*a*. 108*b* and the first and second capacitor dielectric layers 110*a*. 110*b* disposed along a sidewall of the first conductive pillar structure 106*a*. The lateral distance 203 being less than half the width 207 and/or less than the thickness 206 facilitates decreasing the pillar pitch 107, thereby facilitating the increased capacitance density of the capacitor 112. In yet further embodiments, the lateral distance 203 being reduced (e.g., to less than the thickness 206) decreases the equivalent series resistance (ESR) and/or the equivalent series inductance (ESL) of the capacitor 112, thereby increasing an overall performance of the capacitor 112.

A capping layer 124 overlies the third capacitor dielectric layer 110*c*. The capping layer 124 may, for example, be or comprise silicon dioxide or some other suitable dielectric material. An upper dielectric layer 126 overlies the capping layer 124. The upper dielectric layer 126 may, for example, be or comprise silicon dioxide or some other suitable dielectric material. A plurality of conductive contacts 114-118 overlie a corresponding conductive layer in the plurality of conductive layers 108*a-b* or a corresponding conductive pillar structures in the plurality of conductive pillar structures 106. A first conductive contact 114 directly contacts and is directly electrically coupled to the second conductive layer 108*b*. A second conductive contact 116 directly contacts and is directly electrically coupled to the first conductive layer 108*a*. Further, a third conductive contact 118 directly contacts and is directly electrically coupled to a corresponding conductive pillar structure 106. The conductive contacts 114-116 may, for example, be or comprise aluminum, copper, titanium, tantalum, some other conductive material, or the like. A plurality of conductive wires 128 are disposed within the upper dielectric layer 126 and overlie the conductive contacts 114-116. Further, sidewall spacer structures 120 are disposed along sidewalls of the conductive contacts 114-118. The sidewall spacer structures 120 may, for example, be or comprise silicon nitride, silicon carbide, silicon dioxide, or some other suitable dielectric material. The sidewall spacer structures 120 respectively laterally enclose an outer perimeter of a corresponding conductive contact in the plurality of conductive contacts 114-118.

As illustrated in FIG. 2B, a lower dielectric layer 201 laterally encloses an outer perimeter of the capacitor 112. The lower dielectric layer 201 may, for example, be or comprise silicon dioxide or some other suitable dielectric material. In various embodiments, a top surface of the lower dielectric layer 201 is coplanar and/or aligned with a top surface of the third capacitor dielectric layer 110*c* (not shown). In some embodiments, a thickness 209 of the third capacitor dielectric layer 110*c* along a peripheral region of the first capacitor column segment 105*a* is less than the lateral distance 203.

In yet further embodiments, one or more surfaces of the third capacitor dielectric layer 110*c* define a plurality of cavities 202. The cavities 202 are disposed between conductive pillar structures 106 that are diagonally opposite one another. For example, a first cavity 202*a* is spaced laterally between the second conductive pillar structure 106*b* and a third conductive pillar structure 106*c*. In various embodiments, the cavities 202 comprise air. The cavities 202 are configured to reduce stress from the plurality of conductive layers 108*a-b*. For example, during fabrication and/or operation the capacitor 112 may be exposed to high heat, where the conductive layers 108*a-b* may expand as a result of the high heat. The cavities 202 are configured to mitigate stress on layers and/or structures of the capacitor 112 as a result of the expansion of the conductive layers 108*a-b*, thereby further increasing a reliability and/or endurance of the capacitor 112. In various embodiments, a shape of the cavities 202 when viewed in top view are the same and/or are each symmetrical.

In various embodiments, when viewed from above the conductive pillar structures 106 are circular. The conductive layers 108*a-b* respectively comprise a ring-shaped segment concentric with the conductive pillar structures 106. Further, the first and second capacitor dielectric layers 110*a*. 110*b* respectively comprise a ring-shaped segment concentric with the conductive pillar structures 106.

As illustrated in FIG. 2C, in some embodiments, the capping layer 124 seals the cavities 202. For example, the capping layer 124 may seal the cavities 202 to a first pressure. It will be appreciated that the conductive pillar structures 106 are illustrated by dashed boxes in FIG. 2C. In various embodiments, a top of the cavities 202 is disposed above top surfaces of the conductive pillar structures 106. In further embodiments, widths of the cavities 202 are less than widths of the conductive pillar structures 106.

Figure 3A:
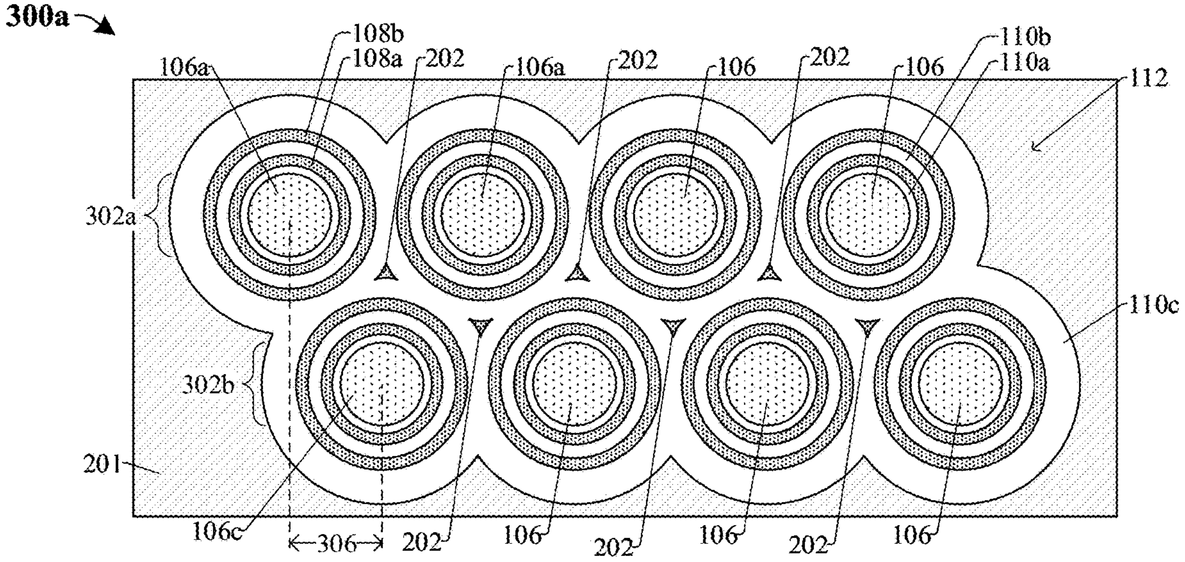
FIGS. 3A and 3B illustrate top views of some other embodiments of the integrated chip of FIGS. 2A-2C.
Figure 3B:
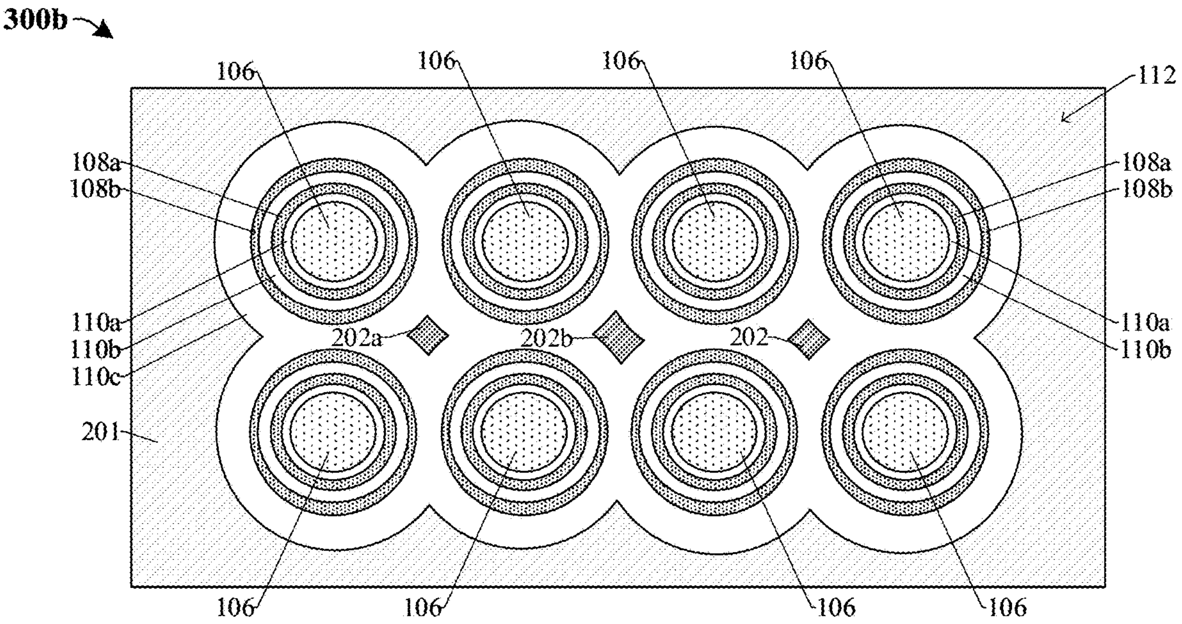

FIGS. 3A and 3B illustrate top views of some other embodiments of the integrated chip of FIGS. 2A-2C. For example, FIGS. 3A and 3B illustrate top views 300*a* and 300*b* that correspond to some other embodiments of the top view 200*b* of FIG. 2B.

As illustrated in FIG. 3A, the capacitor 112 comprises a first row 302*a* and a second row 302*b* of the conductive pillar structures 106. In some embodiments, centers of conductive pillar structures 106 in the first row 302*a* are laterally offset from centers of conductive pillar structures 106 in the second row 302*b*. For example, a center of the first conductive pillar structure 106*a* is laterally offset from a center of the second conductive pillar structure 106*b* by a distance 306.

As illustrates in FIG. 3B, in some embodiments, shapes and/or sizes of the cavities 202 when viewed from above are different from one another. For example, a shape and/or size of a first cavity 202*a* may be different from a shape and/or size of a second cavity 202*b*.

Figure 4A:
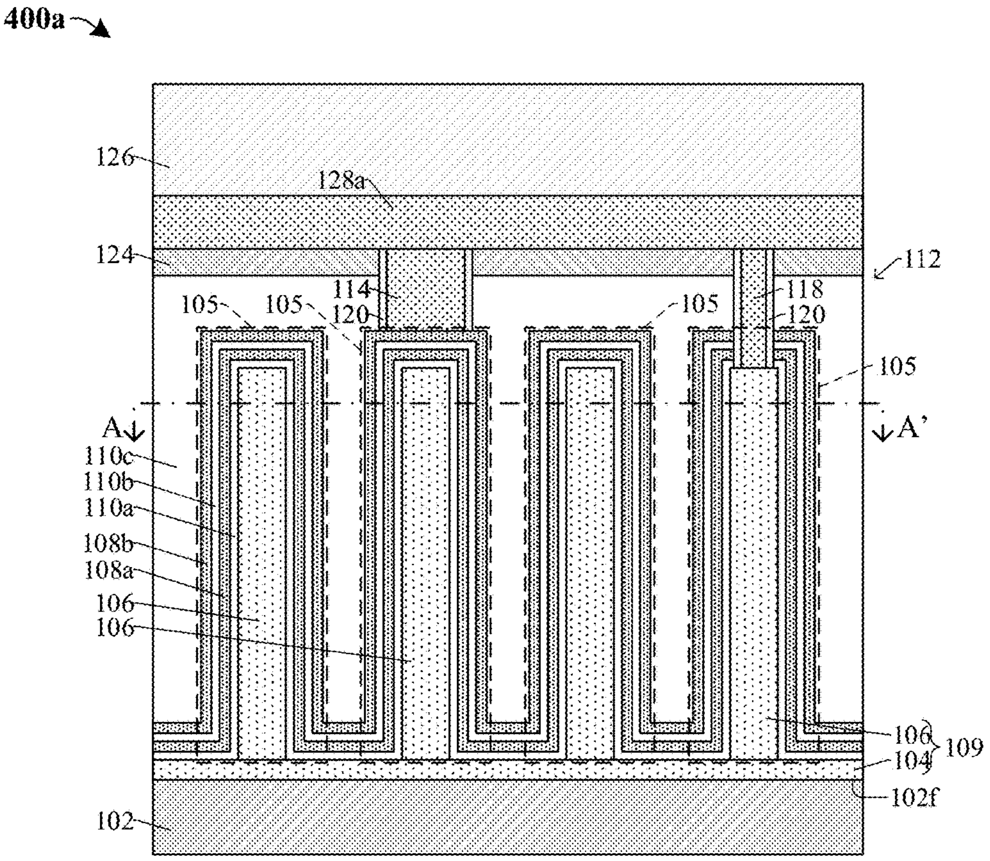
FIG. 4A-4C illustrate various views of yet other embodiments of the integrated chip of FIG. 1.
Figure 4B:
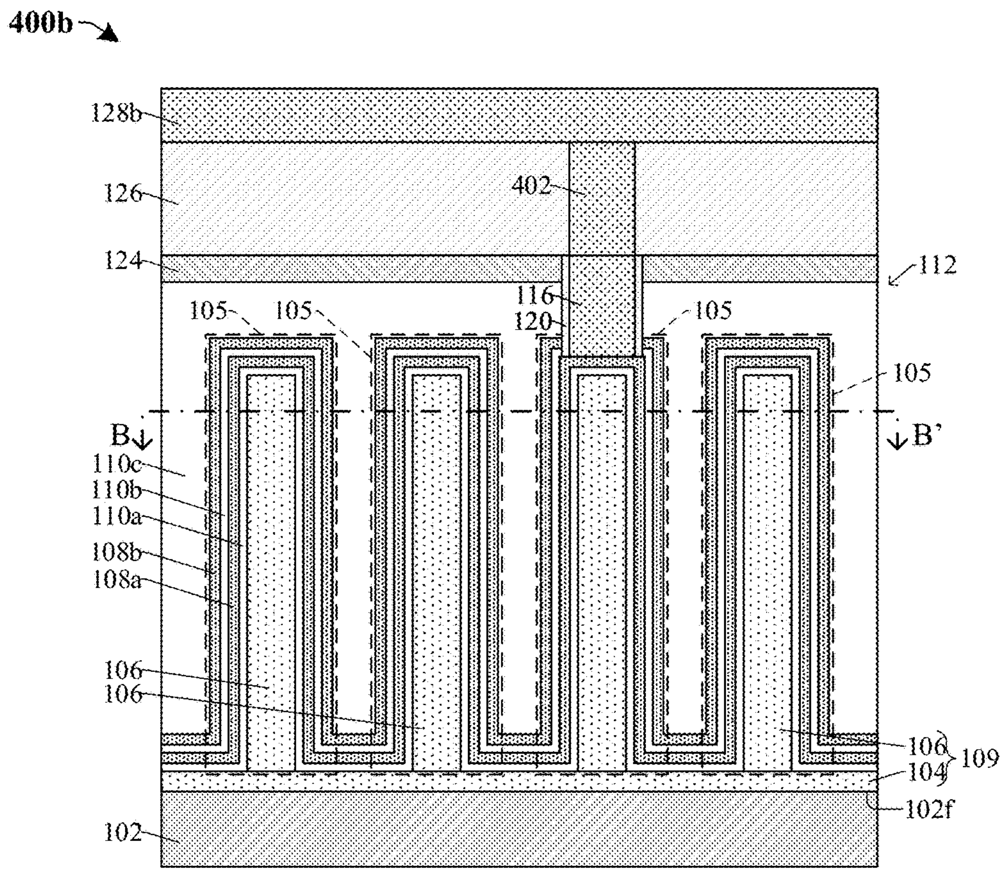
Figure 4C:
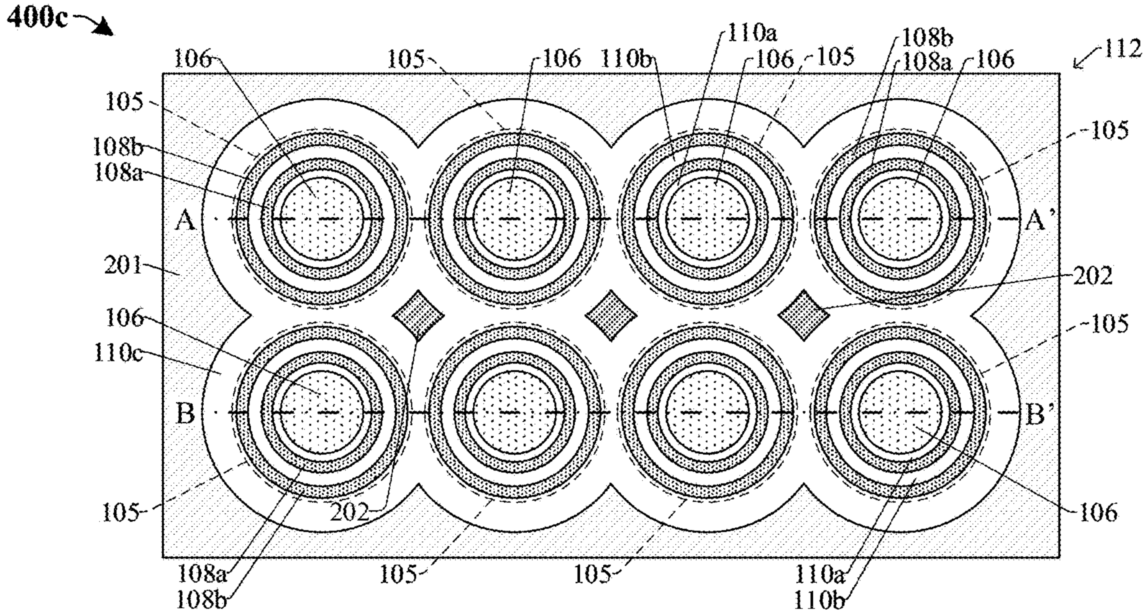

FIGS. 4A-4C illustrate various views of some other embodiments of the integrated chip of FIG. 1. FIG. 4A illustrates a cross-sectional view 400*a* of some embodiments of the integrated chip taken along line A-A' of FIG. 4C. FIG. 4B illustrates a cross-sectional view 400*b* of some embodiments of the integrated chip taken along line B-B' of FIG. 4C. FIG. 4C illustrates a top view 400*c* of some embodiments of the integrated chip.

In various embodiments, the integrated chip comprises a first conductive wire 128*a* and a second conductive wire 128*b*. In some embodiments, the first conductive wire 128*a* continuously extends over a first row of the plurality of conductive pillar structures 106 and is directly electrically coupled to the second conductive layer 108*b* by way of the first conductive contact 114 and is directly electrically coupled to the first electrode structure 109 by way of the third conductive contact 118 (as shown in FIG. 4A). In further embodiments, the second conductive wire 128*b* continuously extends over a second row of the plurality of conductive pillar structures 106 and is directly electrically coupled to the first conductive layer 108*a* by way of the second conductive contact 116 and a conductive via 402.

Figure 5A:
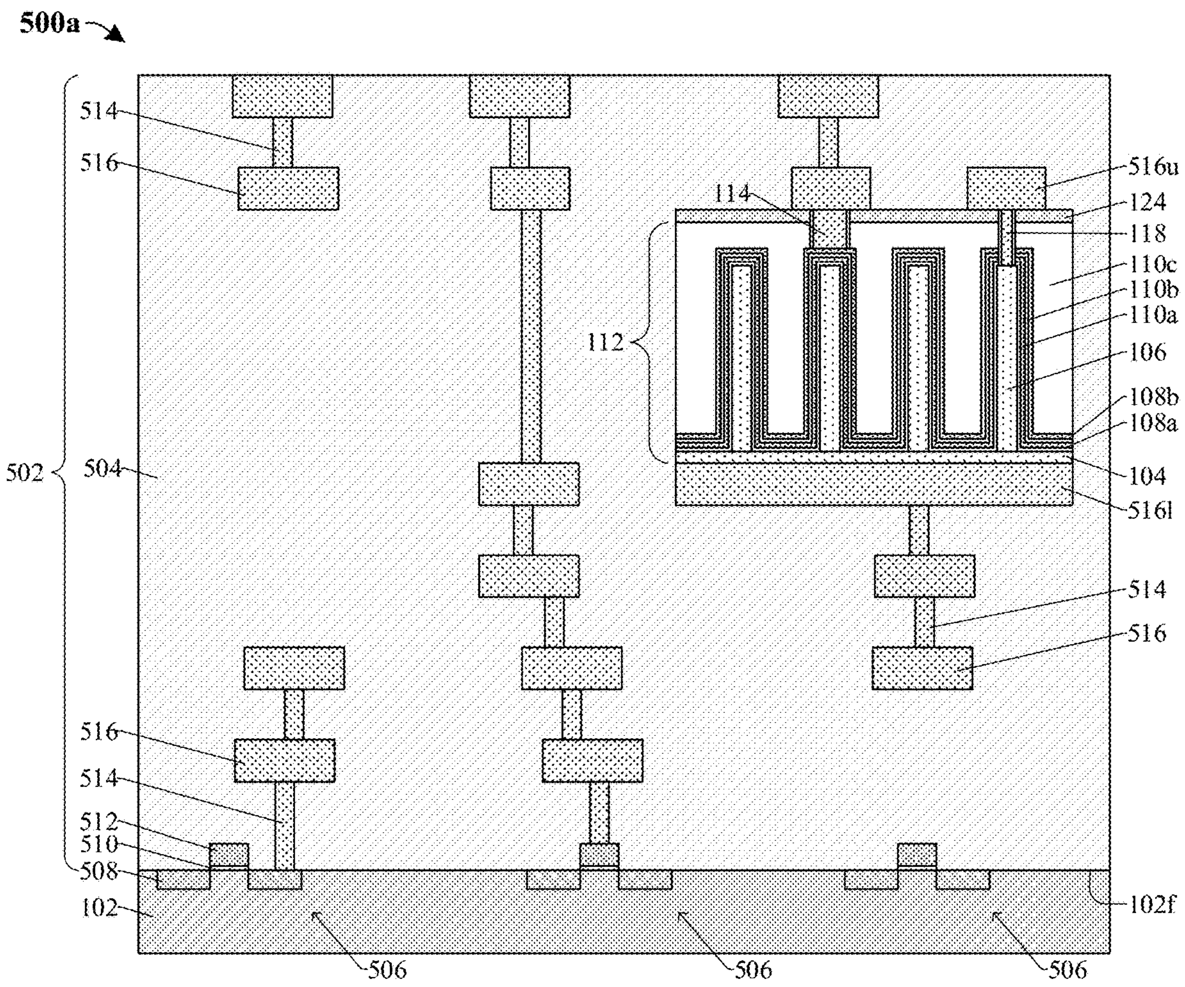
FIG. 5A illustrates a cross-sectional view of some embodiments of an integrated chip comprising a capacitor overlying a transistor disposed within and/or on a semiconductor substrate.

FIG. 5A illustrates a cross-sectional view 500*a* of some embodiments of an integrated chip comprising a capacitor 112 disposed within an interconnect structure 502 that overlies a semiconductor substrate 102.

The interconnect structure 502 comprises a plurality of conductive wires 516 and a plurality of conductive vias 514 disposed within an interconnect dielectric structure 504. A plurality of transistors 506 are disposed within and/or on the front-side surface 102*f* of the semiconductor substrate 102. The transistors 506 may, for example, be a metal-oxide semiconductor field-effect transistor (MOSFET), a bipolar junction transistor (BJT), a high-electric-mobility transistor (HEMT), a fin field-effect transistor (finFET), or the like. The transistors 506 comprise a gate dielectric layer 510 overlying the semiconductor substrate 102, a gate electrode 512 overlying the gate dielectric layer 510, and a pair of source/drain regions 508 disposed in the semiconductor substrate 102 on opposing sides of the gate electrode 512. Source/drain region(s) may refer to a source or a drain, individually or collectively dependent upon the context.

The conductive vias 514 and the conductive wires 516 are configured to facilitate electrical coupling between devices disposed over and/or on the semiconductor substrate 102. Further, the capacitor 112 is disposed within the interconnect structure 502 and is vertically offset from the front-side surface 102*f* of the semiconductor substrate 102 by a non-zero distance. In various embodiments, a lower conductive wire 5161 continuously extends along a bottom surface of the conductive base layer 104 of the capacitor 112. In further embodiments, upper conductive wires 516*u* are electrically coupled to the capacitor 112.

Figure 5B:
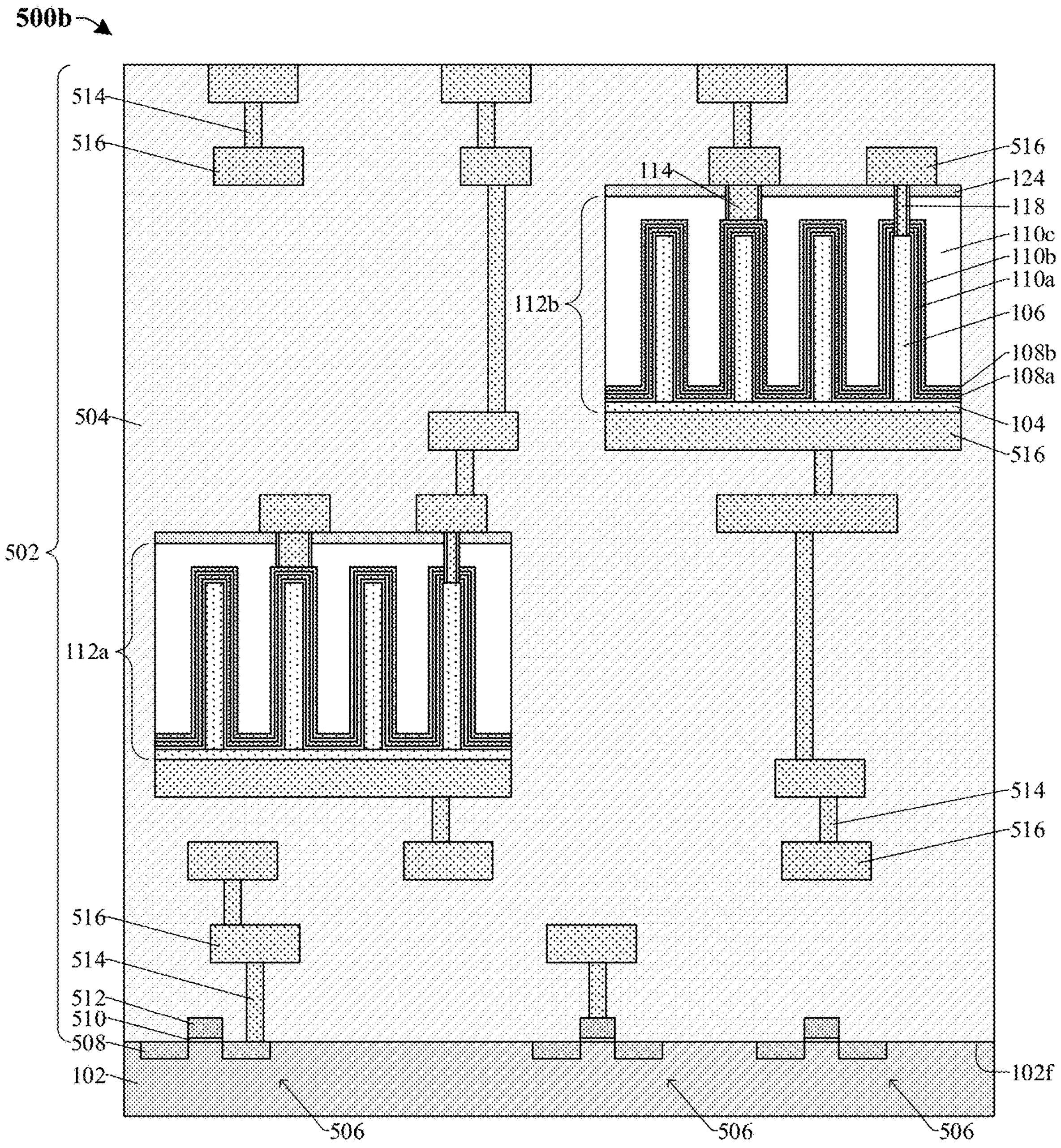
FIG. 5B illustrates a cross-sectional view of some other embodiments of the integrated chip of FIG. 5A.

FIG. 5B illustrates a cross-sectional view 500*b* of some other embodiments of the integrated chip of FIG. 5A, where the integrated chip comprises a first capacitor 112*a* and a second capacitor 112*b* disposed in different metal layers of the interconnect structure 502. In some embodiments, the first and second capacitors 112*a*, 112*b* are respectively configured as the capacitor 112 of FIG. 1, 2A-2C, 3A, 3B, or 4A-4C. In various embodiments, the first capacitor 112*a* is disposed within a lower metal layer of the interconnect structure 502 and the second capacitor 112*b* is disposed within an upper metal layer of the interconnect structure 502 above the first capacitor 112*a*. It will be appreciated that additional capacitors may be disposed in other metal layers of the interconnect structure 502 (not shown).

FIGS. 6-27 illustrate various views of some embodiments of a method for forming an integrated chip comprising a capacitor having a plurality of conductive pillar structures vertically extending from a conductive base layer. Although the various views shown in FIGS. 6-27 are described with reference to a method, it will be appreciated that the structures shown in FIGS. 6-27 are not limited to the method but rather may stand alone separate of the method. Although FIGS. 6-27 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
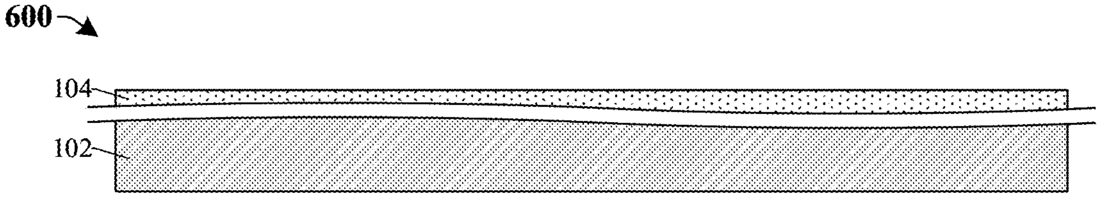
FIGS. 6-27 illustrate various views of some embodiments of a method of forming an integrated chip comprising a capacitor having a plurality of conductive pillar structures vertically extending from a conductive base layer.

As shown in cross-sectional view 600 of FIG. 6, a conductive base layer 104 is formed over a semiconductor substrate 102. The semiconductor substrate 102 may, for example, be or comprise silicon, monocrystalline silicon, a bulk substrate, a silicon-on-insulator (SOI) substrate, or the like. The conductive base layer 104 may be formed over the semiconductor substrate 102 by, for example, a chemical vapor deposition (CVD) process, a physical vapor deposition (PVD) process, an atomic layer deposition (ALD) process, or some other suitable deposition or growth process. In some embodiments, the conductive base layer 104 comprises tungsten, tin, some other metal material, or the like and is formed to a thickness of about 500 angstroms, within a range of about 400 to 600 angstroms, or some other suitable value.

Figure 7:
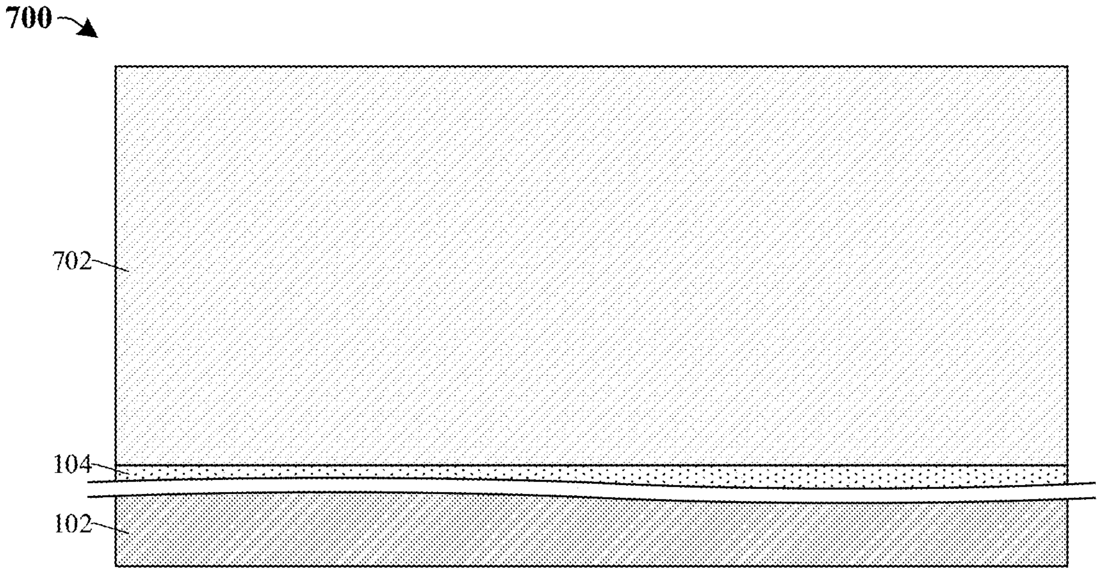

As shown in cross-sectional view 700 of FIG. 7, a dielectric layer 702 is formed over the conductive base layer 104. The dielectric layer 702 may be formed over the conductive base layer 104 by, for example, a CVD process, a PVD process, an ALD process, or some other suitable deposition or growth process. The dielectric layer 702 may, for example, be or comprise silicon dioxide, some other dielectric material, or the like.

Figure 8:
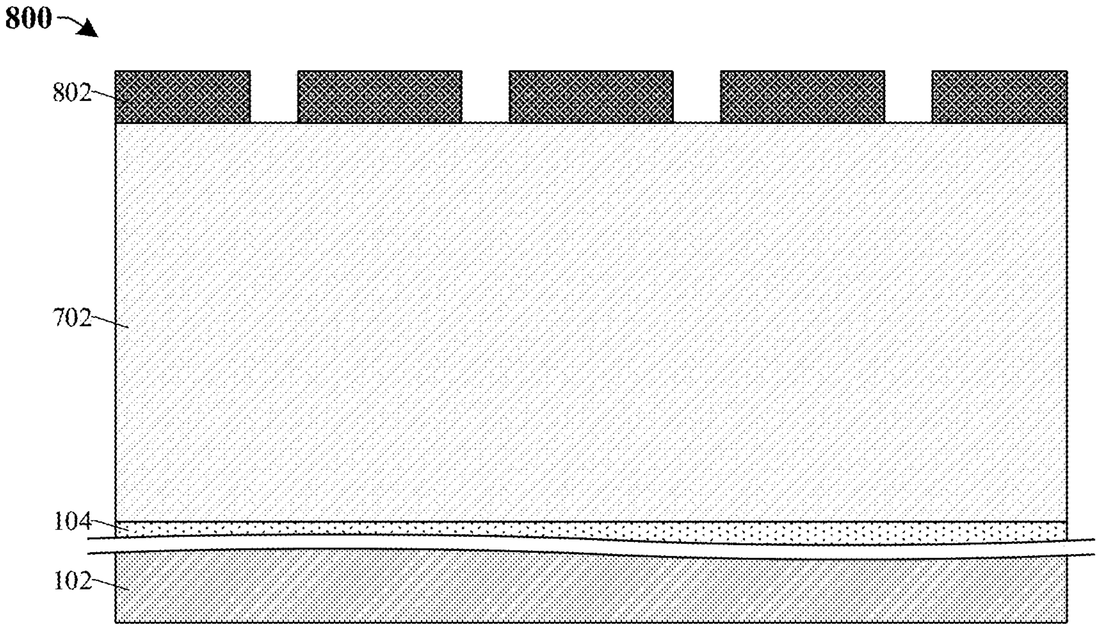

As shown in cross-sectional view 800 of FIG. 8, a masking layer 802 is formed over the dielectric layer 702. The masking layer 802 may, for example, be or comprise a photoresist, silicon nitride, silicon dioxide, some other suitable material, or any combination of the foregoing. In some embodiments, forming the masking layer 802 includes: depositing (e.g., by spin coating or some other suitable process) a masking material (e.g., photoresist) over the dielectric layer 702 and transferring or applying a pattern to the masking material.

Figure 9:
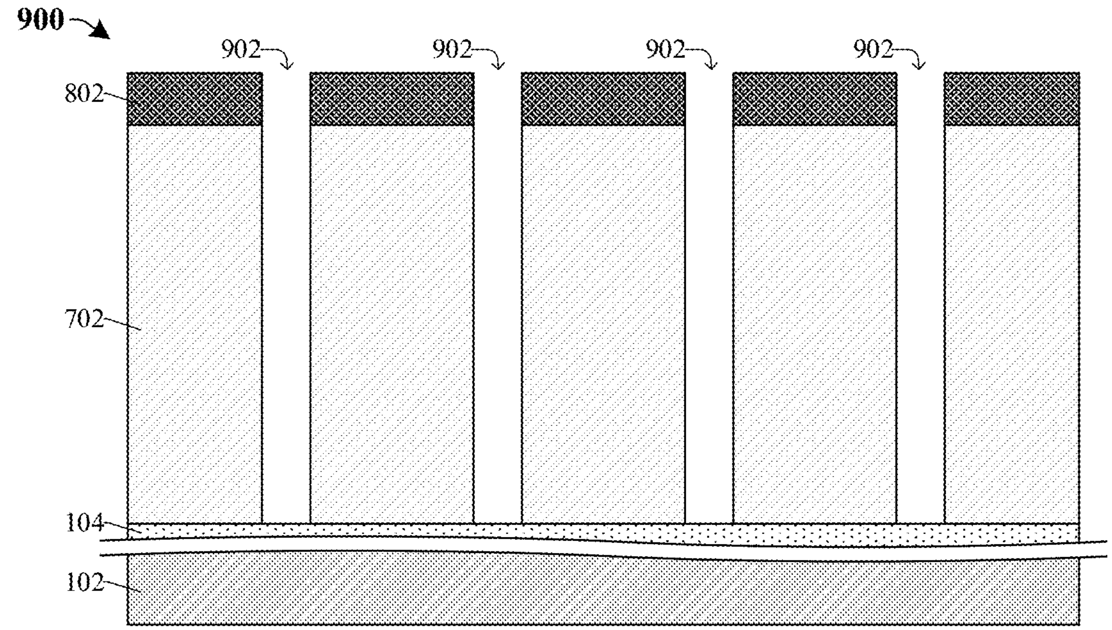

As shown in cross-sectional view 900 of FIG. 9, an etching process is performed on the dielectric layer 702 to form a plurality of openings 902 and expose an upper surface of the conductive base layer 104. In some embodiments, the etching process includes performing a dry etching process, a wet etching process, or any combination of the foregoing. In some embodiments, the masking layer 802 is formed during and/or after the etching process (not shown).

Figure 10:
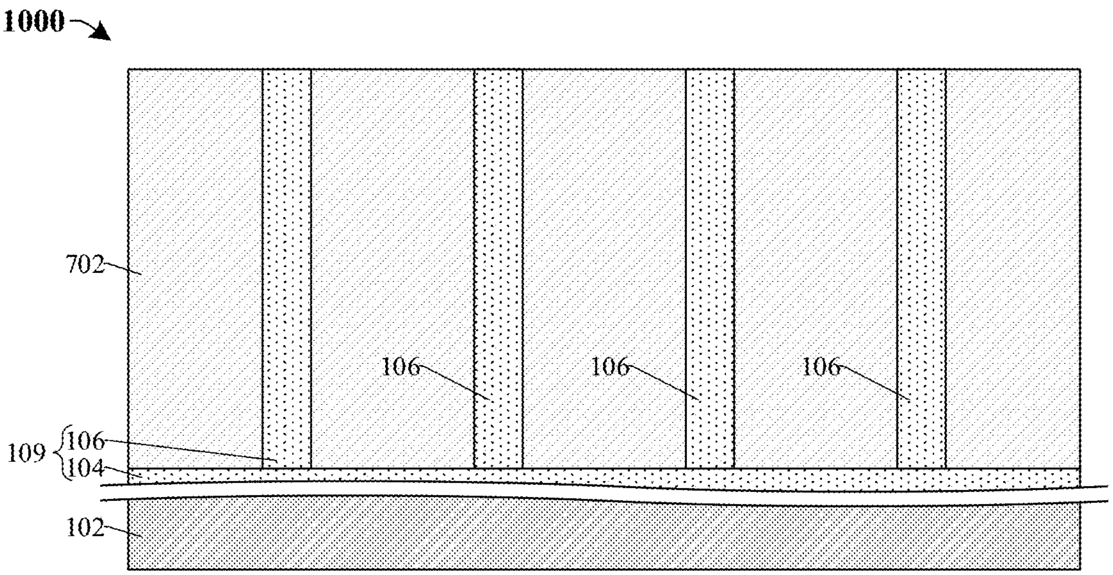

As shown in cross-sectional view 1000 of FIG. 10, a plurality of conductive pillar structures 106 are formed within the openings (902 of FIG. 9) and extend vertically from the upper surface of the conductive base layer 104 in a direction away from the semiconductor substrate 102, thereby defining a first electrode structure 109. The first electrode structure 109 comprises the conductive base layer 104 and the plurality of conductive pillar structures 106. The plurality of conductive pillar structures 106 may be formed over the conductive base layer 104 by, for example, a CVD process, a PVD process, an electro plating process, an electroless plating process, or some other suitable growth or deposition process. The plurality of conductive pillar structures 106 may, for example, be or comprise tungsten, tin, some other metal material, or the like. In various embodiments, the conductive base layer 104 is configured as a seed layer and facilitates growth of the conductive pillar structures 106 over the conductive base layer 104. In some embodiments, the conductive base layer 104 and the plurality of conductive pillar structures 106 comprise a first conductive material (e.g., tungsten). In some embodiments, the plurality of conductive pillar structures 106 are formed by a selective CVD process, some other selective growth or deposition process, electroplating, or the like. In yet further embodiments, a process for forming the conductive pillar structures 106 includes depositing (e.g., by a CVD process, a PVD process, etc.) a conductive pillar material (e.g., tungsten) within the openings (902 of FIG. 9) and performing a planarization process (e.g., chemical mechanical planarization (CMP) process) on the conductive pillar material until a top surface of the dielectric layer 702 is reached.

Figure 11:
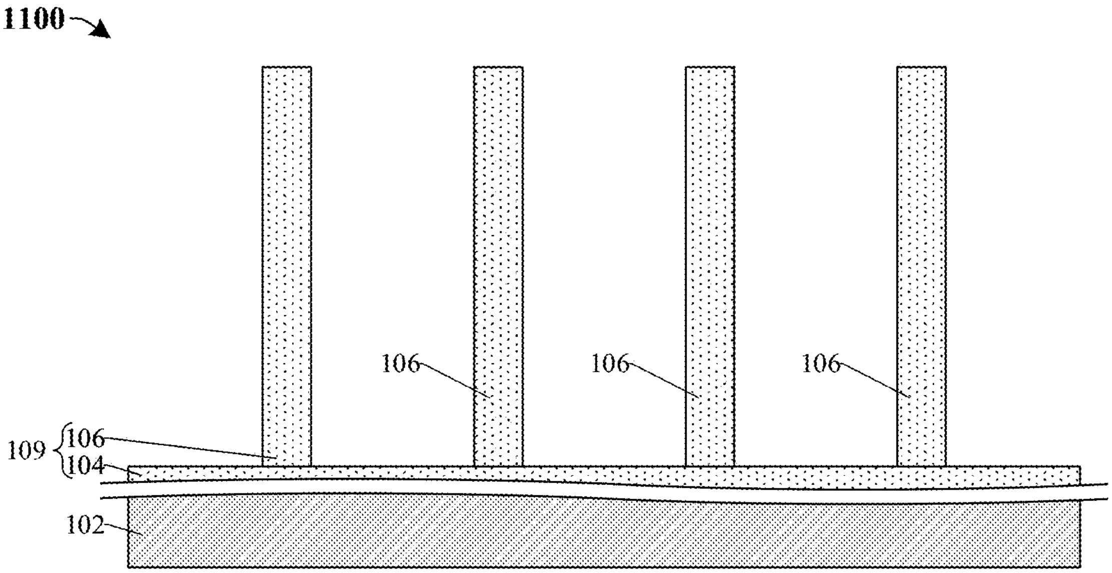

As shown in cross-sectional view 1100 of FIG. 11, the dielectric layer (702 of FIG. 10) is removed, thereby exposing sidewalls of the conductive pillar structures 106 and the upper surface of the conductive base layer 104. In various embodiments, the dielectric layer (702 of FIG. 10) is removed by a wet etch process, a dry etch process, some other suitable removal process, or any combination of the foregoing.

Figure 12:
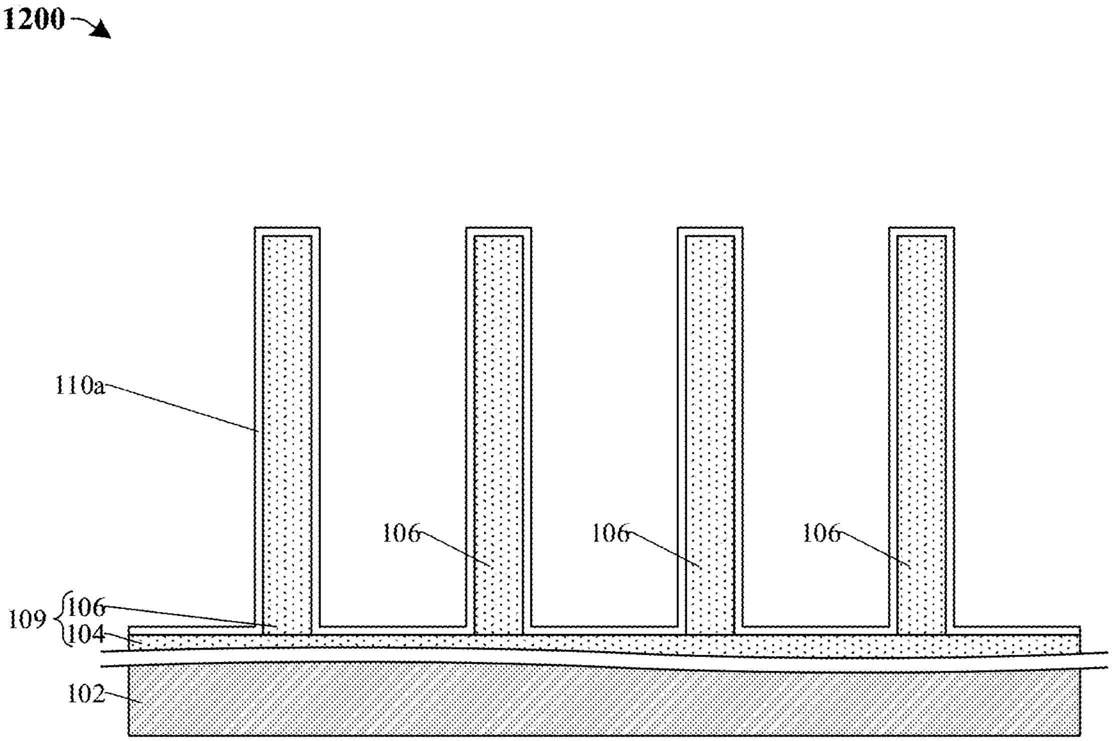

As shown in cross-sectional view 1200 of FIG. 12, a first capacitor dielectric layer 110*a* is formed on the conductive pillar structures 106 and the conductive base layer 104. In various embodiments, the first capacitor dielectric layer 110*a* is deposited by a conformal deposition process such that the first capacitor dielectric layer 110*a* extends along sidewalls and top surfaces of the conductive pillar structures 106. The first capacitor dielectric layer 110*a* may be formed by a conformal ALD process, another conformal deposition process, or some other suitable growth or deposition process. The first capacitor dielectric layer 110*a* may, for example, be or comprise a high-k dielectric material, such as hafnium oxide, zirconium oxide, aluminum oxide, tantalum oxide, titanium oxide, some other suitable dielectric material, or any combination of the foregoing. In some embodiments, the first capacitor dielectric layer 110*a* is formed to a thickness within a range of about 40 to 90 angstroms or some other suitable value.

Figure 13:
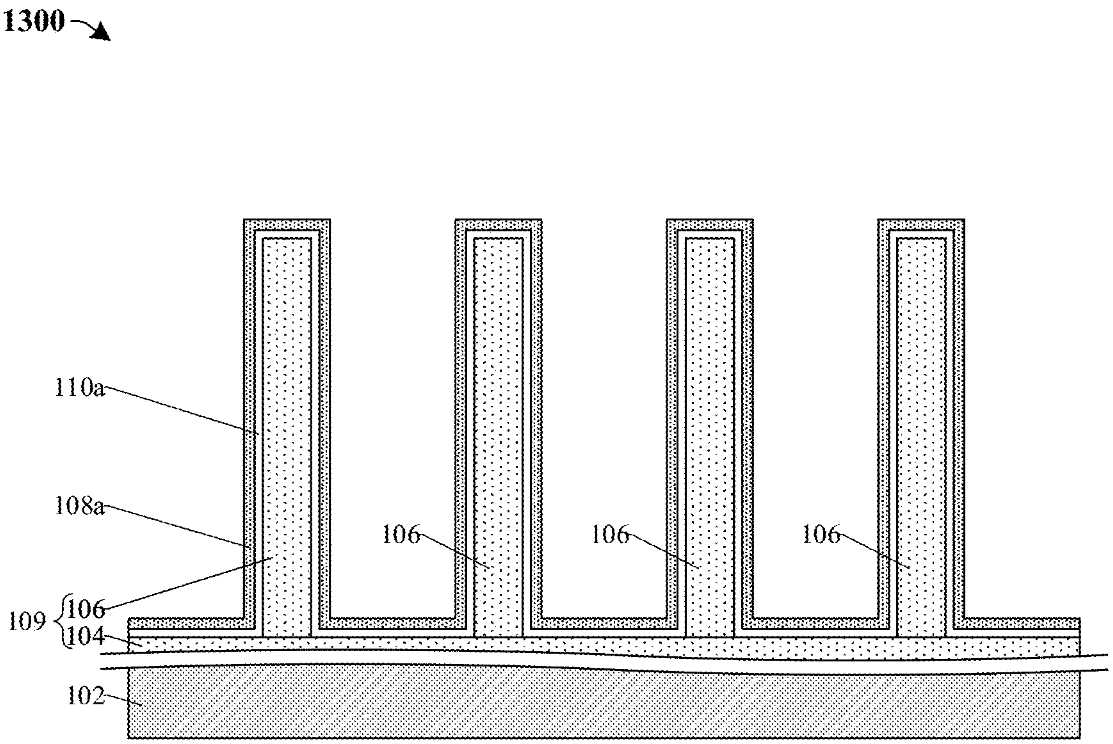

As shown in cross-sectional view 1300 of FIG. 13, a first conductive layer 108*a* is formed on the first capacitor dielectric layer 110*a*. In various embodiments, the first conductive layer 108*a* is deposited by a conformal deposition process such that the first conductive layer 108*a* extends along sidewalls and top surfaces of the conductive pillar structures 106. The first conductive layer 108*a* may, for example, be formed by an ALD process, a CVD process, an electroplating process, or some other suitable growth or deposition process. The first conductive layer 108*a* may, for example, be or comprise titanium nitride, tantalum nitride, some other conductive material, or any combination of the foregoing. In some embodiments, the first conductive layer 108*a* is formed to a thickness within a range of about 150 to 200 angstroms or some other suitable value. In various embodiments, the first conductive layer 108*a* comprises a second conductive material (e.g., titanium nitride) different from the first conductive material of the plurality of conductive pillar structures 106.

Figure 14:
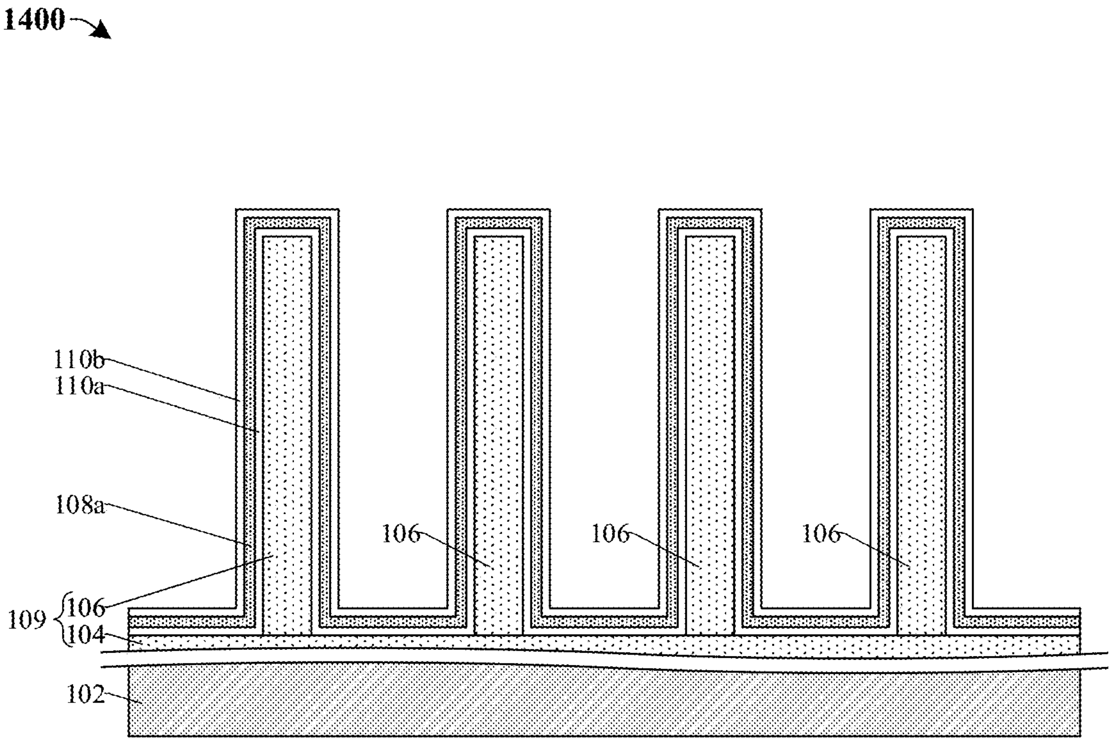

As shown in cross-sectional view 1400 of FIG. 14, a second capacitor dielectric layer 110*b* is formed on the first conductive layer 108*a*. In various embodiments, the second capacitor dielectric layer 110*b* is deposited by a conformal deposition process such that the second capacitor dielectric layer 110*b* extends along sidewalls and top surfaces of the conductive pillar structures 106. The second capacitor dielectric layer 110*b* may be formed by a conformal ALD process, another conformal deposition process, or some other suitable growth or deposition process. The second capacitor dielectric layer 110*b* may, for example, be or comprise a high-k dielectric material, such as hafnium oxide, zirconium oxide, aluminum oxide, tantalum oxide, titanium oxide, some other suitable dielectric material, or any combination of the foregoing. In some embodiments, the second capacitor dielectric layer 110*b* is formed to a thickness within a range of about 40 to 90 angstroms or some other suitable value.

Figure 15:
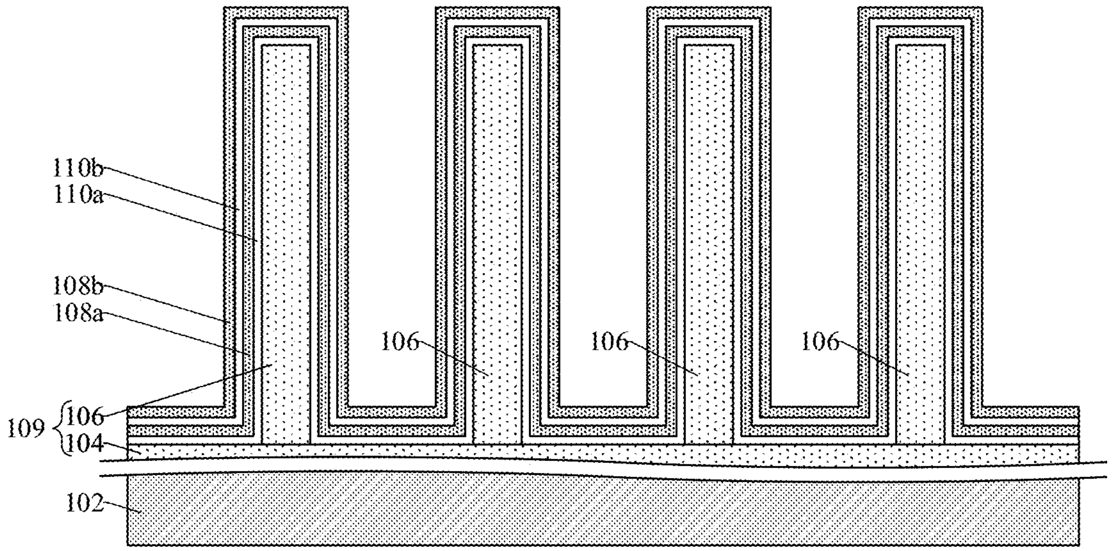

As shown in cross-sectional view 1500 of FIG. 15, a second conductive layer 108*b* is formed on the second capacitor dielectric layer 110*b*, thereby defining a plurality of conductive layers 108*a-b*. In various embodiments, the second conductive layer 108*b* is deposited by a conformal deposition process such that the second conductive layer 108*b* extends along sidewalls and top surfaces of the conductive pillar structures 106. The second conductive layer 108*b* may, for example, be formed by an ALD process, a CVD process, an electroplating process, or some other suitable growth or deposition process. The second conductive layer 108*b* may, for example, be or comprise titanium nitride, tantalum nitride, some other conductive material, or any combination of the foregoing. In some embodiments, the second conductive layer 108*b* is formed to a thickness within a range of about 150 to 200 angstroms or some other suitable value. In various embodiments, the second conductive layer 108*b* comprises the second conductive material (e.g., titanium nitride) different from the first conductive material of the plurality of conductive pillar structures 106.

Figure 16A:
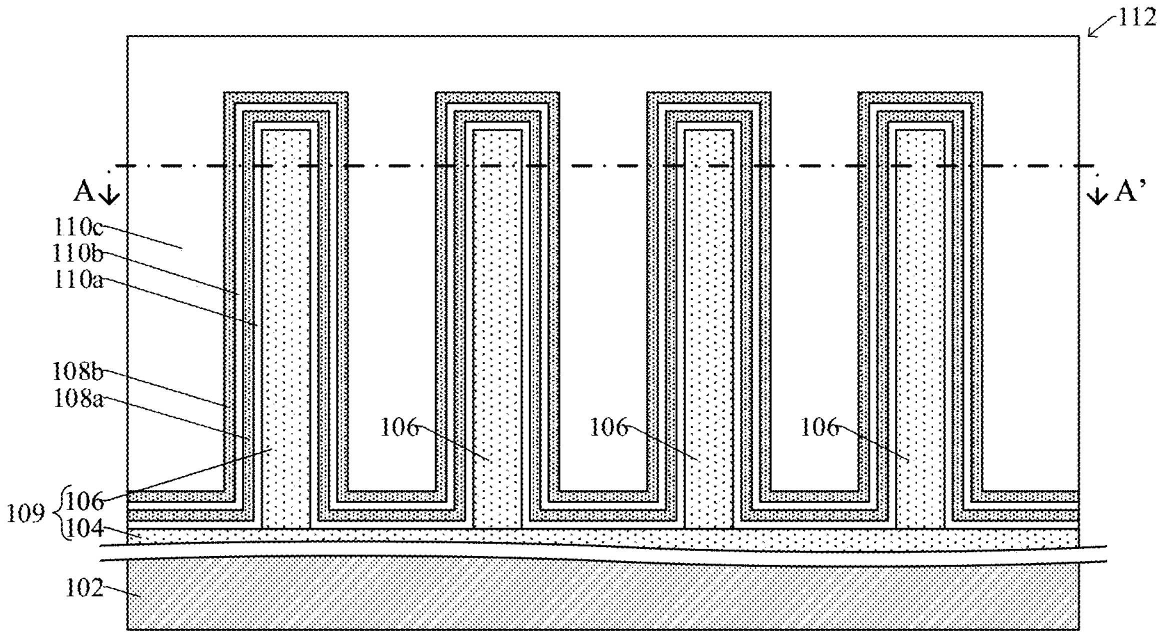
Figure 16B:
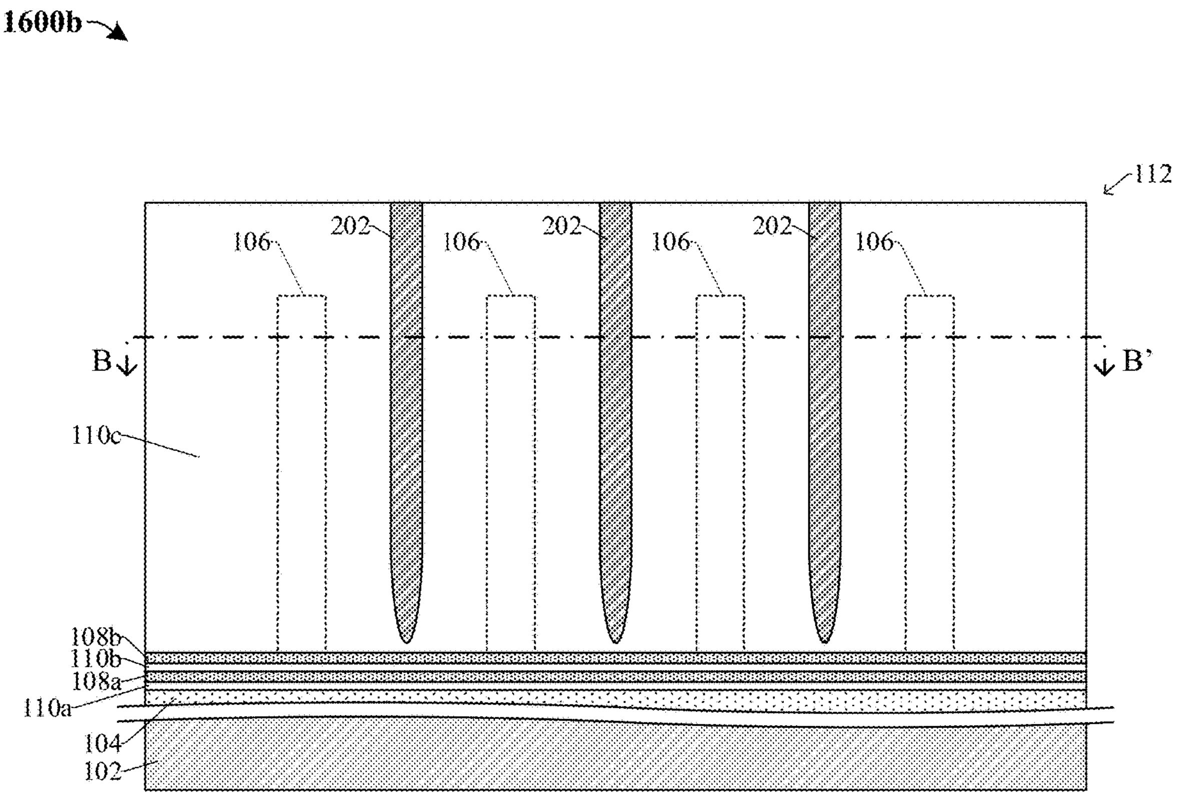
Figure 16C:
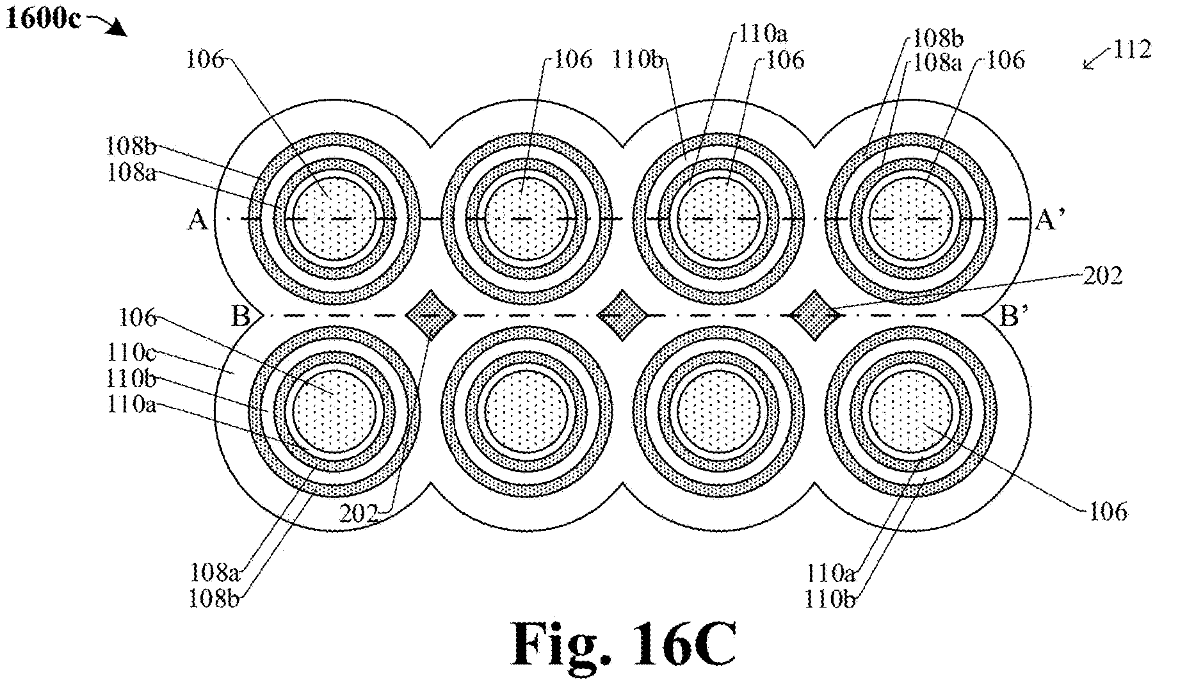

As shown in the various views of FIGS. 16A-16C, a third capacitor dielectric layer 110*c* is formed on the second conductive layer 108*b*, thereby defining a plurality of capacitor dielectric layers 110*a-c* and defining a capacitor 112. FIG. 16A illustrates some embodiments of a cross-sectional view 1600*a* taken along line A-A' of top view 1600*c* of FIG. 16C. FIG. 16B illustrates some embodiments of a cross-sectional view 1600*b* taken along line B-B' of top view 1600*c* of FIG. 16C.

In some embodiments, the third capacitor dielectric layer 110*c* is deposited by a conformal deposition process such that the third capacitor dielectric layer 110*c* extends along sidewalls and top surfaces of the conductive pillar structures 106. The third capacitor dielectric layer 110*c* may be formed by a conformal ALD process, another conformal deposition process, or some other suitable growth or deposition process. The third capacitor dielectric layer 110*c* may, for example, be or comprise a high-k dielectric material, such as hafnium oxide, zirconium oxide, aluminum oxide, tantalum oxide, titanium oxide, some other suitable dielectric material, or any combination of the foregoing. In some embodiments, the third capacitor dielectric layer 110*c* is formed to a thickness within a range of about 40 to 90 angstroms, within a range of 40 to 500 angstroms, or some other suitable value. In various embodiments, the thickness of the third capacitor dielectric layer 110*c* is greater than thicknesses of the first and second capacitor dielectric layers 110*a*, 110*b*.

As illustrated in cross-sectional view 1600*b* of FIG. 16B and top view 1600*c* of FIG. 16C, the third capacitor dielectric layer 110*c* is formed such that a plurality of cavities 202 are disposed between conductive pillar structures 106 that are diagonally opposite one another. The cavities 202 are defined at least in part by one or more surfaces of the third capacitor dielectric layer 110*c*, and may be or comprise air. The cavities 202 are configured to reduce stress as a result of the plurality of conductive layers 108*a-b* and/or the plurality of capacitor dielectric layers 110*a-c* expending while exposed to heat during fabrication and/or operation of the capacitor 112. As a result, the cavities 202 mitigate delamination and/or cracking of layers and/or structures of the capacitor 112, thereby increasing an endurance and/or reliability of the capacitor 112.

Figure 17A:
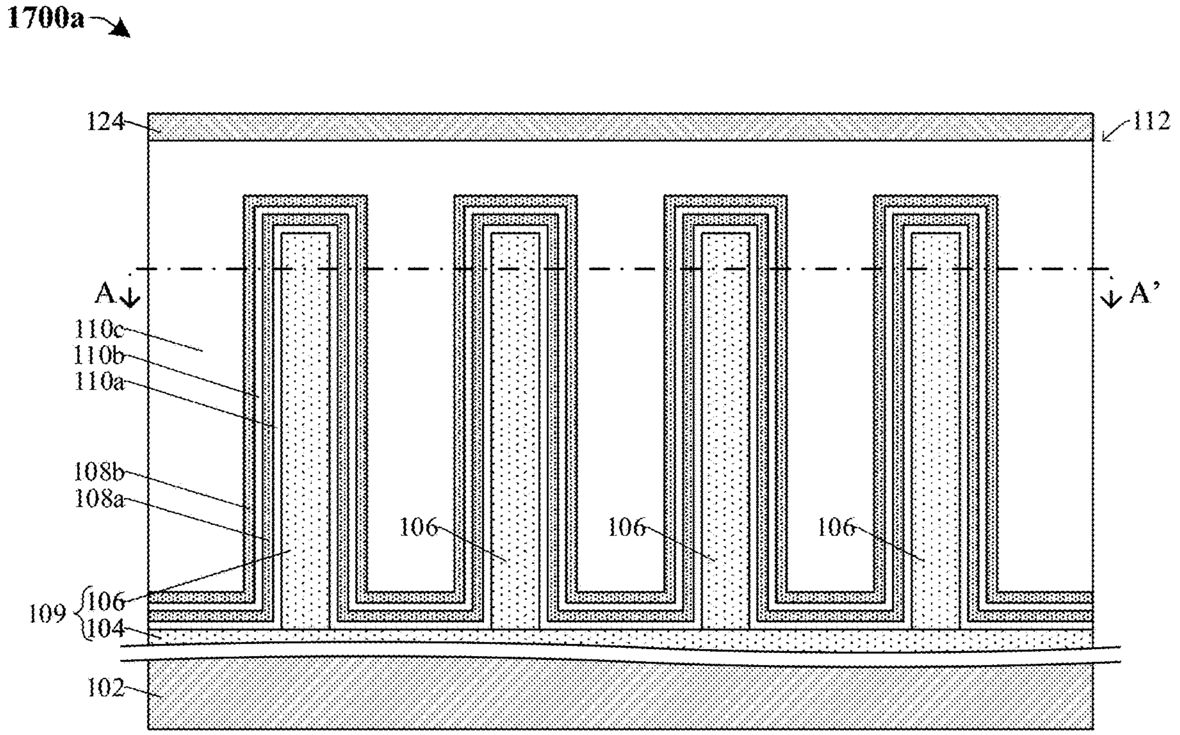
Figure 17B:
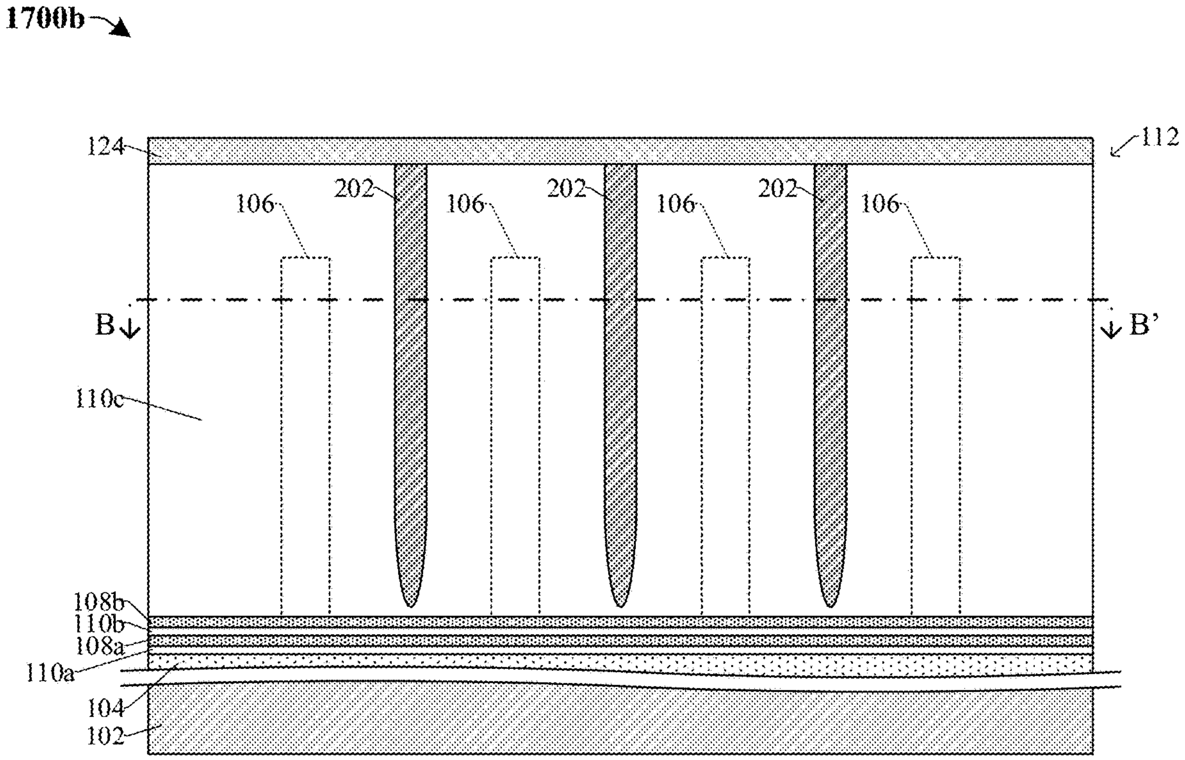
Figure 17C:
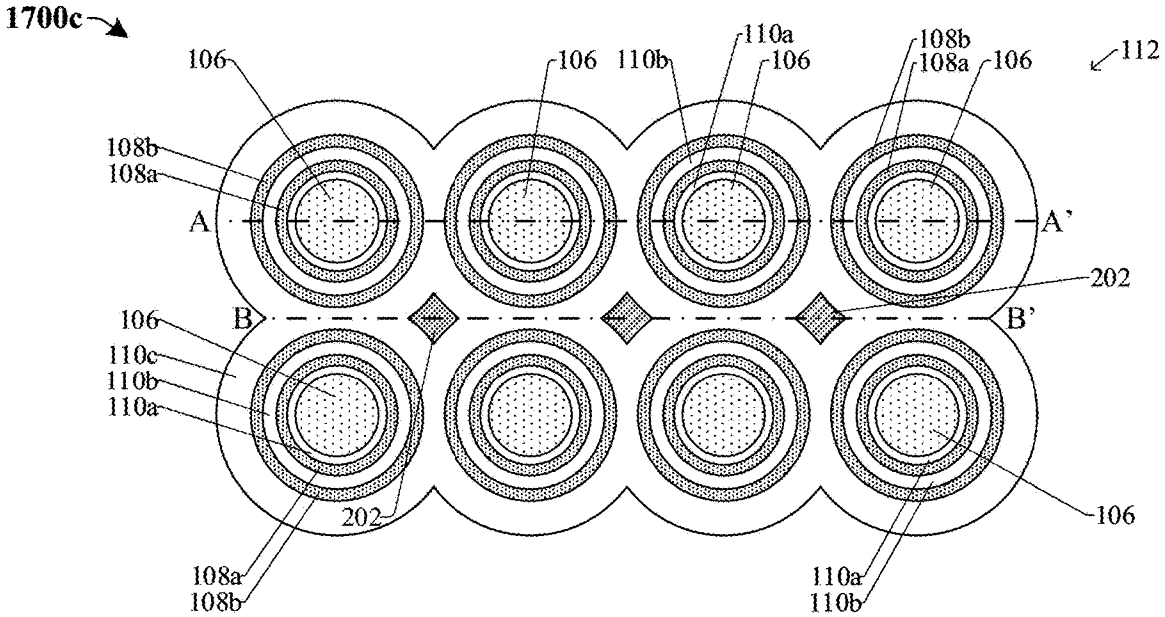

As shown in the various views of FIGS. 17A-17C, a capping layer 124 is formed over the third capacitor dielectric layer 110*c*, thereby sealing the cavities 202. FIG. 17A illustrates some embodiments of a cross-sectional view 1700*a* taken along line A-A' of top view 1700*c* of FIG. 17C. FIG. 17B illustrates some embodiments of a cross-sectional view 1700*b* taken along line B-B' of top view 1700*c* of FIG. 17C.

In some embodiments, the capping layer 124 is formed by a plasma-enhanced CVD (PECVD) process or some other suitable deposition or growth process at a relatively low temperature (e.g., within a range of about 200 to 450 degrees Celsius or less than 450 degrees Celsius). In various embodiments, by virtue of the capping layer 124 being formed by the PECVD process at the relatively low temperature (e.g., less than 450 degrees Celsius) the cavities 202 may be sealed without the capping layer 124 filling the cavities 202. Further, forming the capping layer 124 at the relatively low temperature mitigates exposing the plurality of conductive layers 108*a-b* to relatively high heat (e.g., greater than 450 degrees Celsius), thereby mitigating cracking and/or delamination in layers of the capacitor 112. In yet further embodiments, after depositing the capping layer 124 over the third capacitor dielectric layer 110*c* a planarization process (e.g., a CMP process) is performed on the capping layer 124 such that a top surface of the capping layer 124 is substantially flat.

Figure 18:
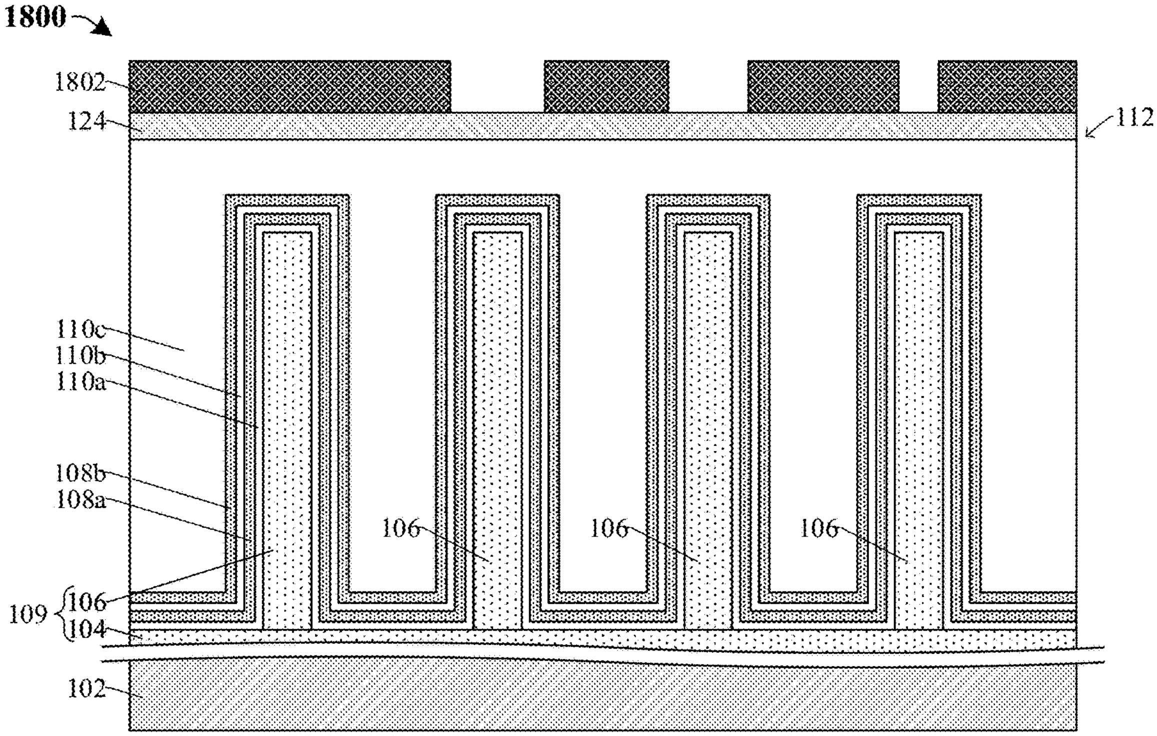

As shown in cross-sectional view 1800 of FIG. 18, a masking layer 1802 is formed over the capping layer 124. The masking layer 1802 may, for example, be or comprise a photoresist, silicon nitride, silicon dioxide, some other suitable material, or any combination of the foregoing. In some embodiments, forming the masking layer 1802 includes: depositing (e.g., by spin coating or some other suitable deposition process) a masking material (e.g., photoresist) over the capping layer 124 and transferring or applying a pattern to the masking material.

Figure 19:
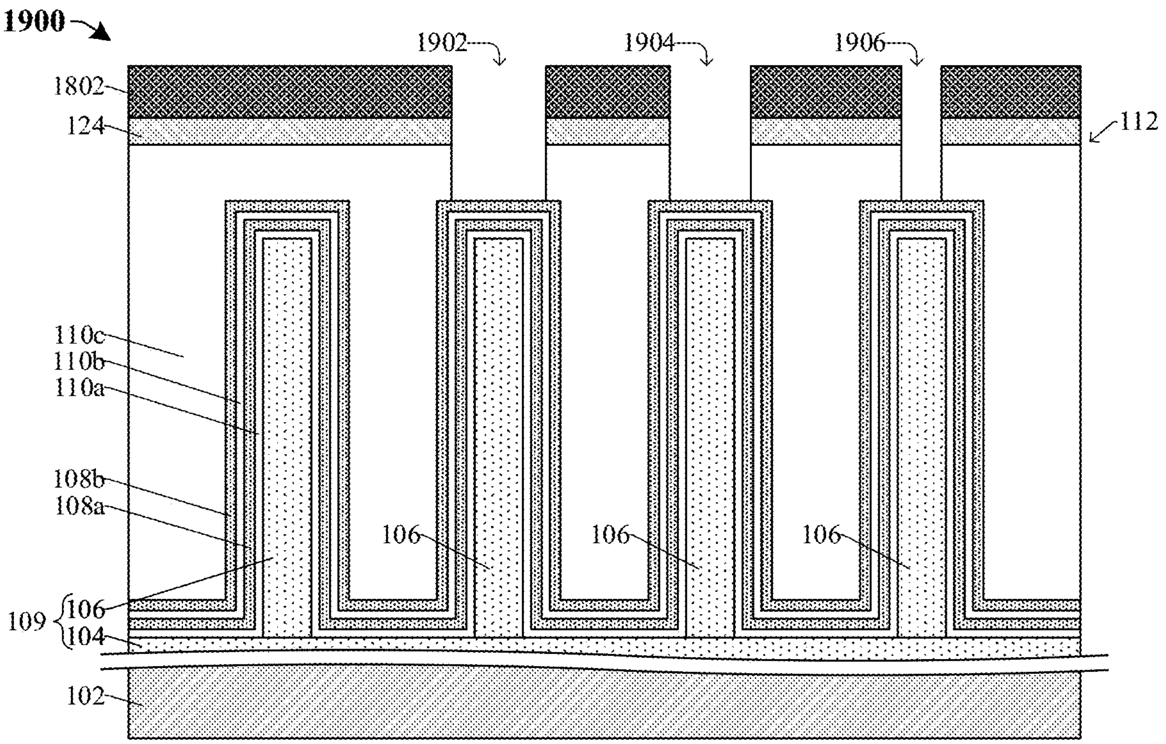

As shown in cross-sectional view 1900 of FIG. 19, a first etching process is performed on the third capacitor dielectric layer 110*c* to form a plurality of contact openings 1902-1906 over the capacitor 112. In various embodiments, the first etching process includes performing a wet etch process, a dry etch process, or any combination of the foregoing. In some embodiments, widths of the contact openings 1902-1906 are different from one another. For example, a width of a first contact opening 1902 is greater than a width of a second contact opening 1904, and a width of a third contact opening 1906 is less than the width of the second contact opening 1904.

Figure 20:
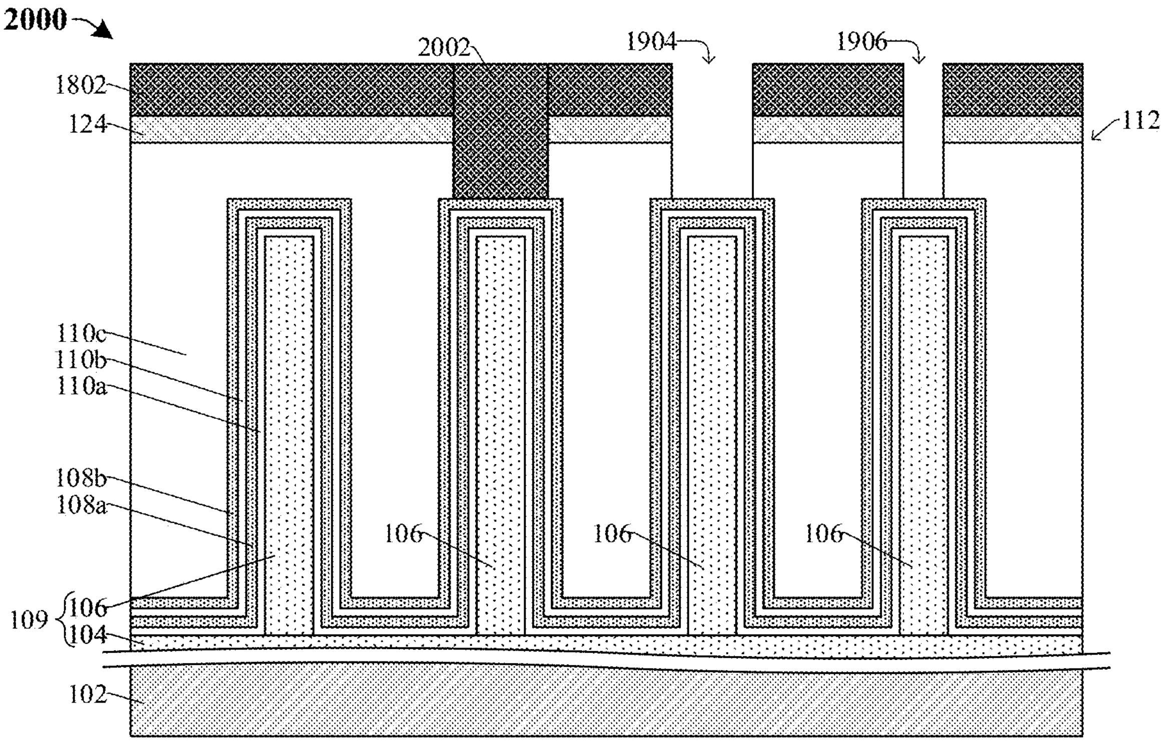

As shown in cross-sectional view 2000 of FIG. 20, a first masking fill structure 2002 is formed within the first contact opening (1902 of FIG. 19). The first masking fill structure 2002 may, for example, be formed by spin coating, some other suitable growth or deposition process, or the like. In some embodiments, the first masking fill structure 2002 comprises a same material (e.g., photoresist) as the masking layer 1802.

Figure 21:
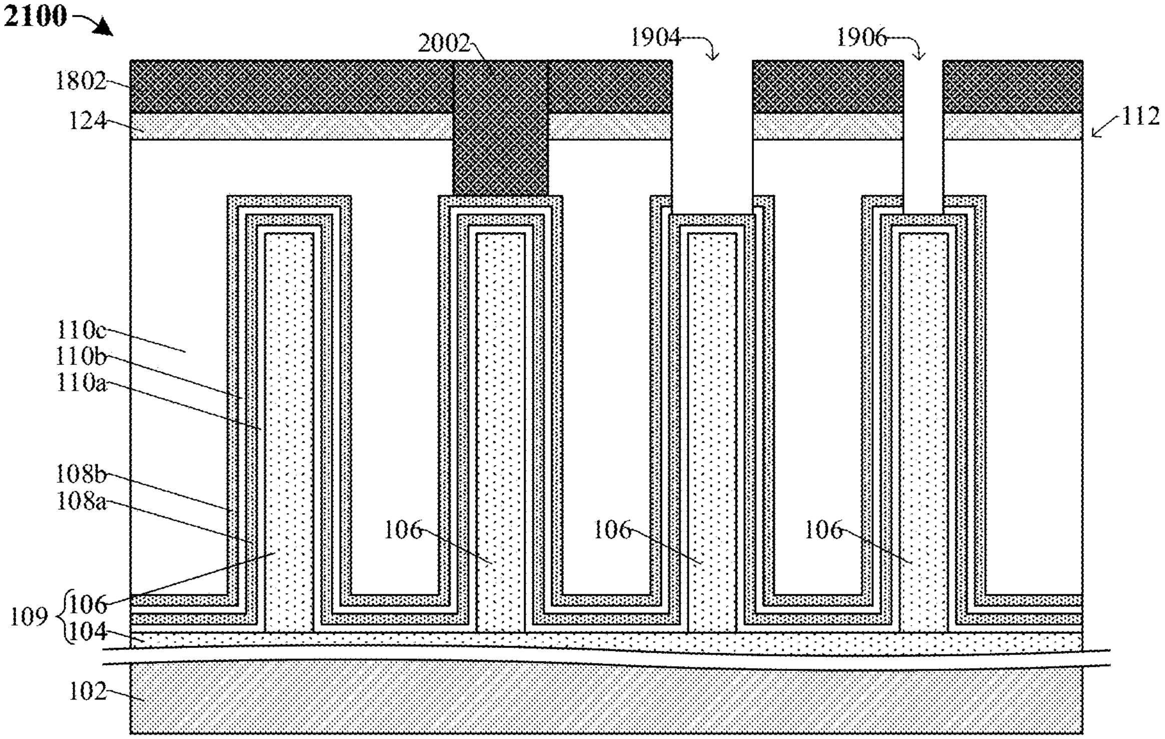

As shown in cross-sectional view 2100 of FIG. 21, a second etching process is performed on the second conductive layer 108*b* and/or the second capacitor dielectric layer 110*b*, thereby expanding the second and third contact openings 1904, 1906. In various embodiments, the second etching process exposes at least a portion of a top surface of the first conductive layer 108a. In various embodiments, the second etching process includes performing a wet etch process, a dry etch process, or any combination of the foregoing.

Figure 22:
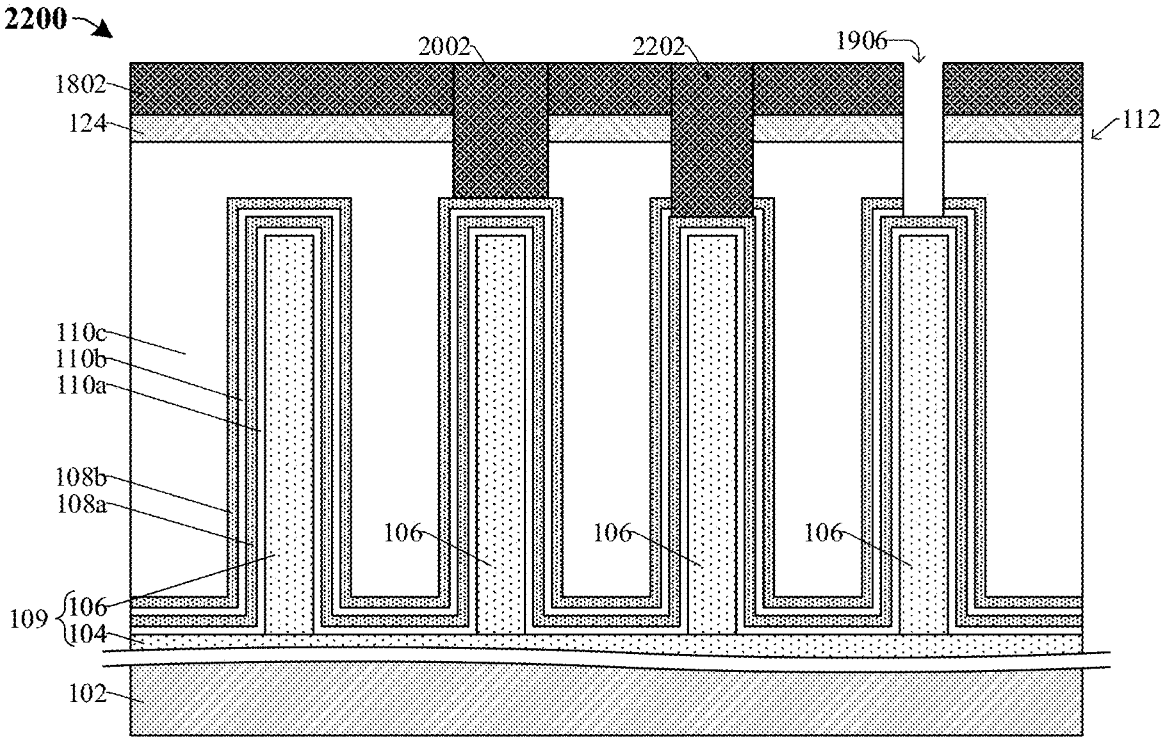

As shown in cross-sectional view 2200 of FIG. 22, a second masking fill structure 2202 is formed within the second contact opening (1904 of FIG. 21). The second masking fill structure 2202 may, for example, be formed by spin coating, some other suitable growth or deposition process, or the like. In some embodiments, the second masking fill structure 2202 comprises the same material (e.g., photoresist) as the masking layer 1802.

Figure 23:
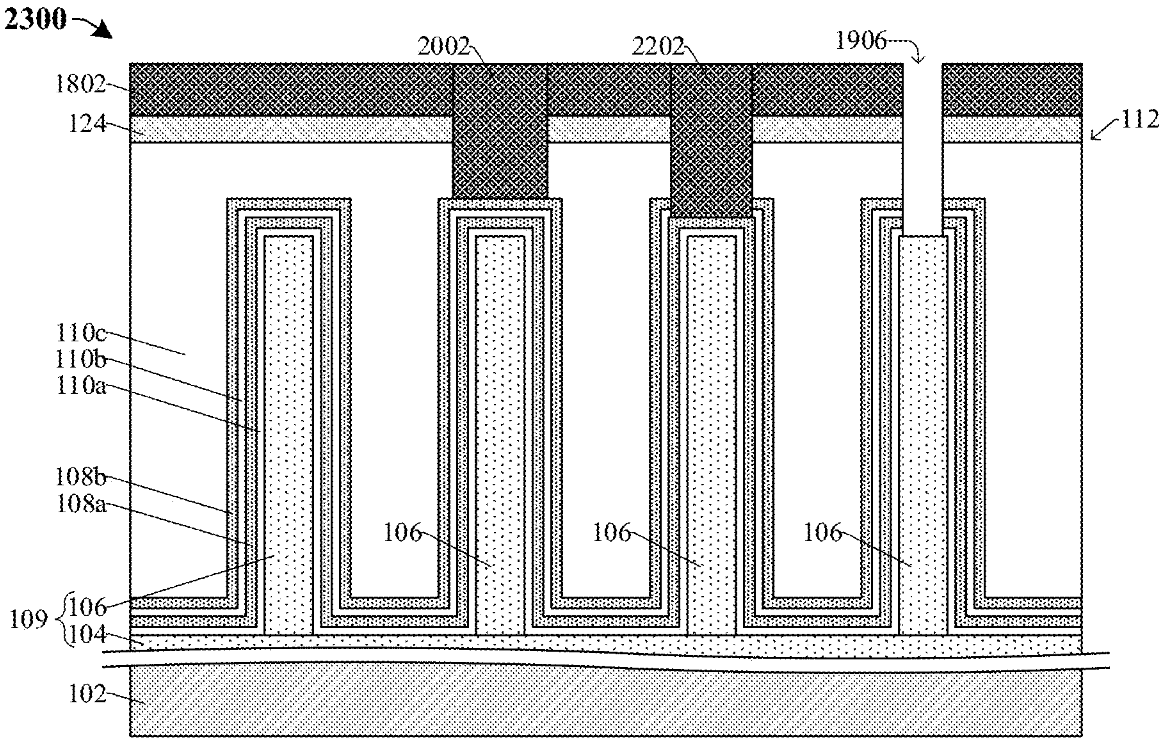

As shown in cross-sectional view 2300 of FIG. 23, a third etching process is performed on the first conductive layer 108a and/or the first capacitor dielectric layer 110a, thereby expanding the third contact opening 1906 and exposing a top surface of at least one conductive pillar structure in the plurality of conductive pillar structures 106. In some embodiments, the third etching process includes performing a wet etch process, a dry etch process, or any combination of the foregoing.

In various embodiments, after performing the third etching process a lower dielectric layer (e.g., 201 of FIG. 2B) is formed over and/or around the capacitor 112 (not shown). The lower dielectric layer (e.g., 201 of FIG. 2B) may, for example, be formed by a CVD process, a PVD process, an ALD process, or some other suitable growth or deposition process. In various embodiments, after depositing the lower dielectric layer (e.g., 201 of FIG. 2B) a planarization process (e.g., a CMP process) may be performed on the lower dielectric layer (e.g., 201 of FIG. 2B). In such embodiments, the planarization process may remove the masking layer 1802 and/or portions of the first and second masking fill structures 2002, 2202.

Figure 24:
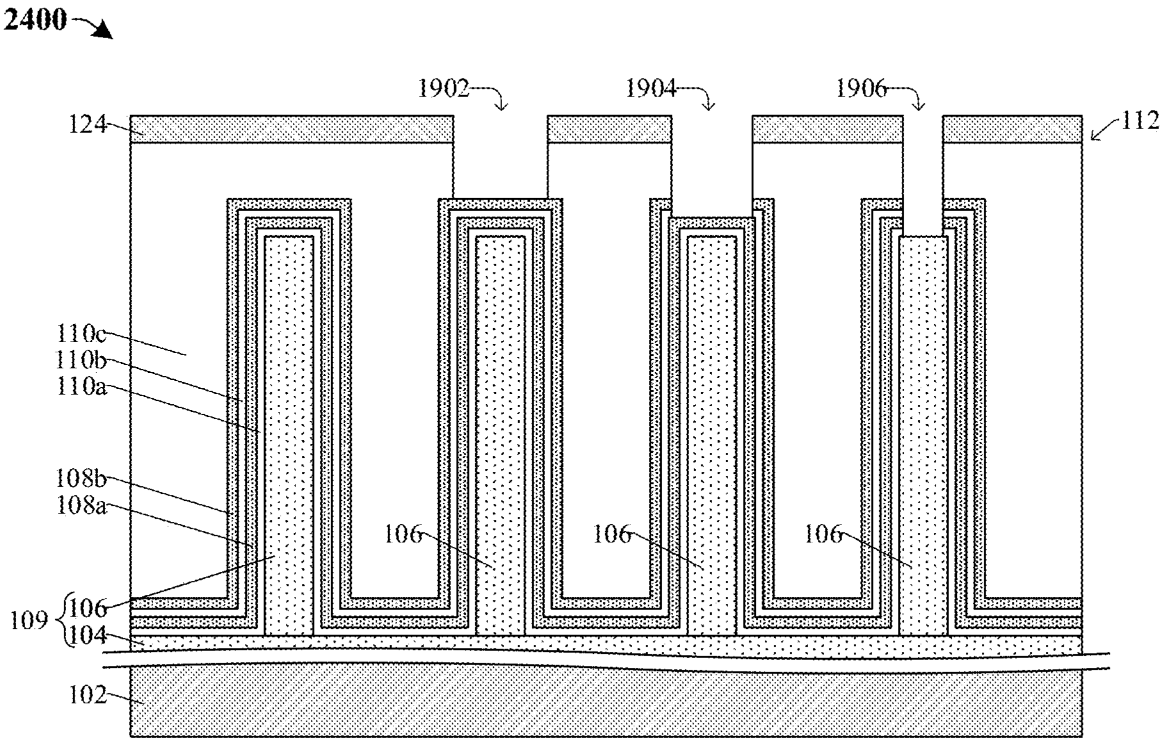

As shown in cross-sectional view 2400 of FIG. 24, a removal process is performed to remove the masking layer (1802 of FIG. 23) and the first and second masking fill structures (2002, 2202 of FIG. 23), thereby exposing top surfaces of the first and second conductive layers 108a, 108b. In some embodiments, the removal process includes performing a plasma ashing process, a wet etch process, or some other suitable removal process.

Figure 25:
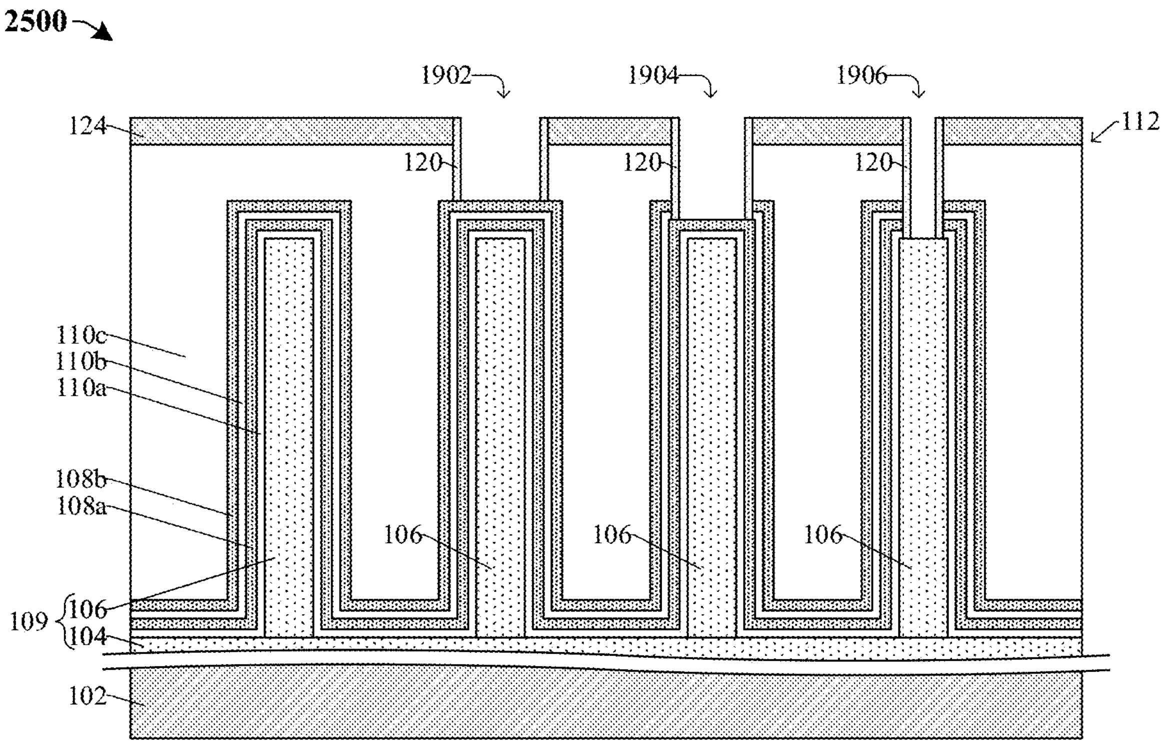

As shown in cross-sectional view 2500 of FIG. 25, a plurality of sidewall spacer structures 120 are formed lining the plurality of contact openings 1902-1906. In some embodiments, a process for forming the plurality of sidewall spacer structures 120 includes: depositing (e.g., by CVD, PVD, ALD, etc.) a spacer layer over the capacitor 112 and etching (e.g., by a dry etch process) the spacer layer to remove the spacer layer from horizontal surfaces. The plurality of sidewall spacer structures 120 may, for example, be or comprise silicon nitride, silicon carbide, silicon dioxide, some other suitable dielectric material, or any combination of the foregoing.

Figure 26:
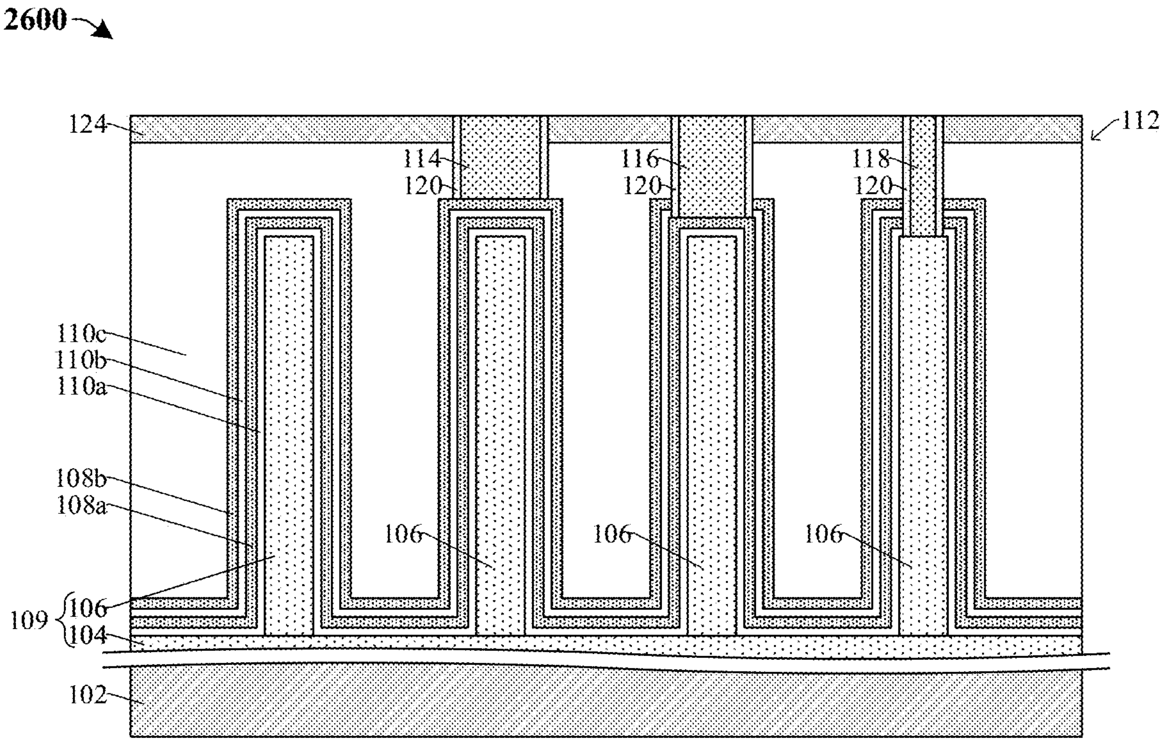

As shown in cross-sectional view 2600 of FIG. 26, a plurality of conductive contacts 114-118 are formed within the plurality of contact openings (1902-1906 of FIG. 25). In some embodiments, a process for forming the plurality of conductive contacts 114-118 includes: depositing (e.g., by CVD, PVD, sputtering, electroplating, electroless plating, etc.) a conductive contact material within the contact openings 1902-1906 and performing a planarization process (e.g., a CMP process) on the conductive contact material. The conductive contacts 114-118 may, for example, be or comprise copper, aluminum, ruthenium, titanium nitride, tantalum nitride, some other suitable conductive material, or any combination of the foregoing. In various embodiments, the plurality of sidewall spacer structures 120 respectively laterally enclose an individual conductive contact in the plurality of conductive contacts 114-118.

Figure 27:
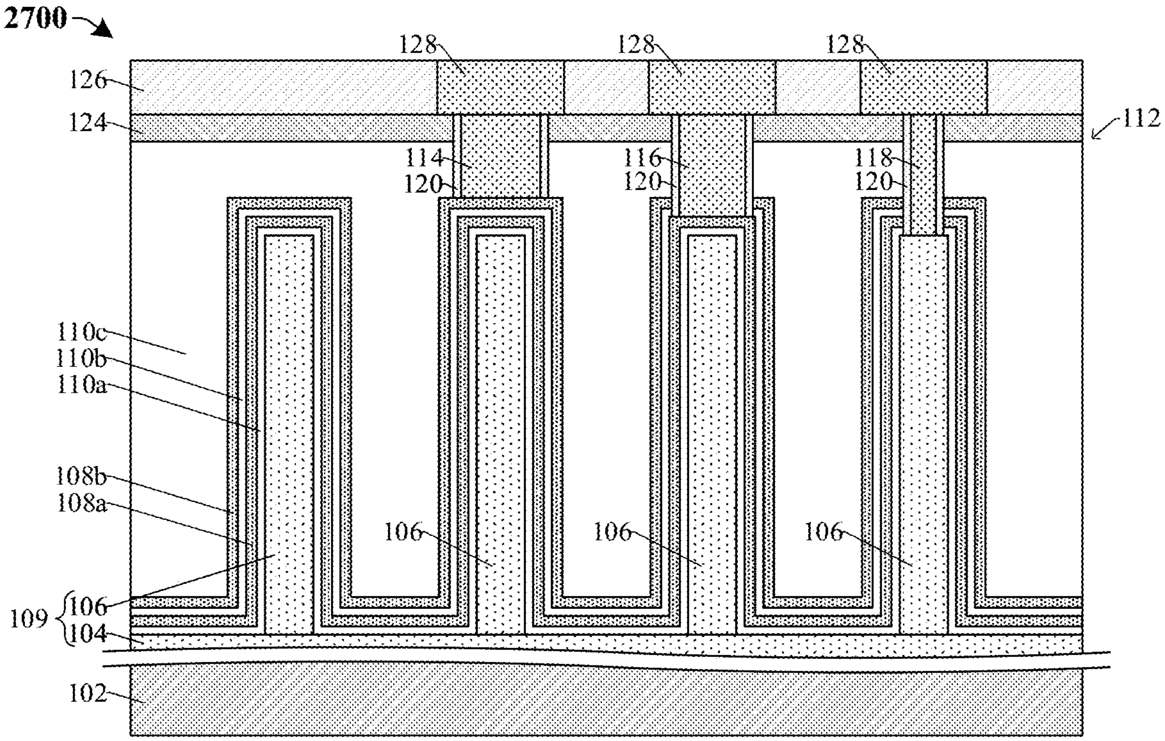

As shown in cross-sectional view 2700 of FIG. 27, an upper dielectric layer 126 and a plurality conductive wires 128 are formed over the plurality of conductive contacts 114-118. In some embodiments, the upper dielectric layer 126 is formed over the capping layer 124 by a CVD process, a PVD process, an ALD process, or some other suitable growth or deposition process. The upper dielectric layer 126 may, for example, be or comprise an oxide such as silicon dioxide, some other dielectric material, or the like. In various embodiments, a process for forming the plurality of conductive wires 128 includes: forming a masking layer (not shown) over the upper dielectric layer 126; etching the upper dielectric layer 126 with the masking layer in place to form a plurality of wire openings in the upper dielectric layer 126; depositing (e.g., by PVD, CVD, electroplating, electroless plating, etc.) a conductive material (e.g., aluminum, copper, ruthenium, tungsten, etc.) within the plurality of wire openings; and performing a planarization process (e.g., a CMP process) on the conductive material.

Figure 28:
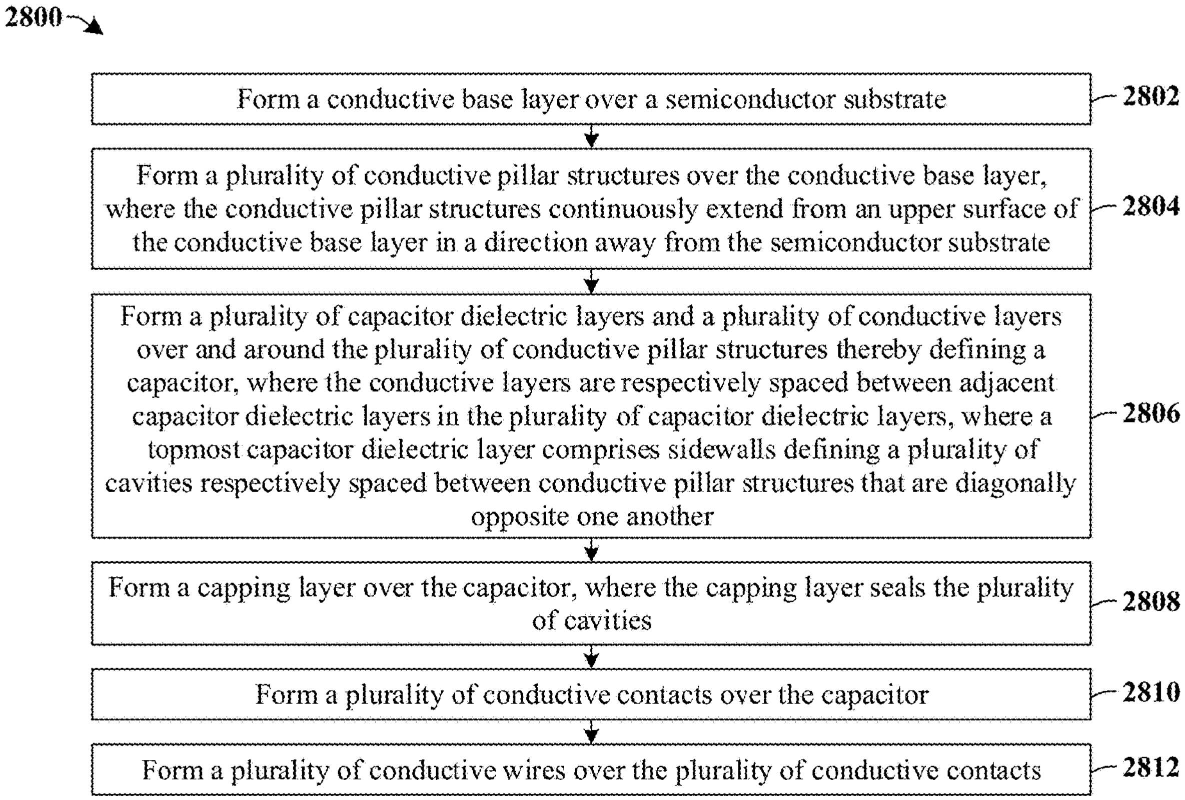
FIG. 28 illustrates a flow diagram of some embodiments of a method for forming an integrated chip comprising a capacitor having a plurality of conductive pillar structures vertically extending from a conductive base layer.

FIG. 28 illustrates a flow diagram of some embodiments of a method 2800 for forming an integrated chip comprising a capacitor having a plurality of conductive pillar structures vertically extending from a conductive base layer. Although the method 2800 is illustrated and/or described as a series of acts of events, it will be appreciated that the method 2800 is not limited to the illustrated ordering or acts. Thus, in some embodiments, the acts may be carried out in different orders than illustrated and/or may be carried out concurrently. Further, in some embodiments, the illustrated acts or events may be subdivided into multiple acts or events, which may be carried out at separate times or concurrently with other acts of sub-acts. In some embodiments, some illustrated acts or events may be omitted and other un-illustrated acts or events may be included.

At act 2802, a conductive base layer is formed over a semiconductor substrate. FIG. 6 illustrates a cross-section view 600 of some embodiments corresponding to act 2802.

At act 2804, a plurality of conductive pillar structures are formed over the conductive base layer, where the conductive pillar structures continuously extend from an upper surface of the conductive base layer in a direction away from the semiconductor substrate. FIGS. 7-11 illustrate cross-sectional views 700-1100 of some embodiments corresponding to act 2804.

At act 2806, a plurality of capacitor dielectric layers and a plurality of conductive layers are formed over and around the plurality of conductive pillar structures, thereby defining a capacitor. The conductive layers are respectively spaced between adjacent capacitor dielectric layers in the plurality of capacitor dielectric layers. A topmost capacitor dielectric layer comprises sidewalls defining a plurality of cavities respectively spaced between conductive pillar structures that are diagonally opposite one another. FIGS. 12-16C illustrate various views of some embodiments corresponding to act 2806.

At act 2808, a capping layer is formed over the capacitor, where the capping layer seals the plurality of cavities. FIGS. 17A-17C illustrate various views of some embodiments corresponding to act 2808.

At act 2810, a plurality of conductive contacts are formed over the capacitor. FIGS. 18-26 illustrate various cross-sectional views 1800-2600 of some embodiments corresponding to act 2810.

At act 2812, a plurality of conductive wires are formed over the plurality of conductive contacts. FIG. 27 illustrates a cross-sectional view 2700 of some embodiments corresponding to act 2812.

Accordingly, in some embodiments, the present disclosure relates to an integrated chip comprising a plurality of conductive pillar structures continuously extending upward from a conductive base layer. A plurality of conductive capacitor dielectric layers and a plurality of conductive layers overlying and laterally enclosing outer perimeters of the conductive pillar structures.

In some embodiments, the present application provides an integrated chip including: a semiconductor substrate; a conductive base layer overlying the semiconductor substrate; a plurality of conductive pillar structures vertically extending from the conductive base layer in a direction away from the semiconductor substrate, wherein the conductive pillar structures are laterally offset from one another; and a plurality of conductive layers and a plurality of capacitor dielectric layers disposed over the conductive pillar structures, wherein the conductive layers and the capacitor dielectric layers are stacked alternatingly with one another, wherein the conductive layers and the capacitor dielectric layers laterally wrap around outer perimeters of the conductive pillar structures. In an embodiment, the conductive base layer and the plurality of conductive pillar structures comprise a first conductive material, wherein the plurality of conductive layers comprise a second conductive material different from the first conductive material. In an embodiment, widths of the conductive pillar structures are greater than thicknesses of the conductive layers. In an embodiment, the plurality of conductive pillar structures comprise a first conductive pillar structure laterally offset from a second conductive pillar structure, wherein the plurality of capacitor dielectric layers define a cavity disposed between the first conductive pillar structure and the second conductive pillar structure. In an embodiment, a width of the cavity is less than a width of the first conductive pillar structure. In an embodiment, a height of the cavity is greater than a height of the first conductive pillar structure. In an embodiment, the integrated chip further includes a capping layer overlying the plurality of capacitor dielectric layers, wherein the capping layer seals the cavity. In an embodiment, a height of a top conductive layer in the plurality of conductive layers is greater than a height of the plurality of conductive pillar structures.

In some embodiments, the present application provides an integrated chip including: a semiconductor substrate; a capacitor overlying a front-side surface of the semiconductor substrate, wherein the capacitor comprises a plurality of capacitor column segments extending upward from a top surface of a conductive base layer, the plurality of capacitor column segments respectively comprise a plurality of conductive layers and a plurality of capacitor dielectric layers extending along sidewalls and a top surface of a conductive pillar structure, wherein the plurality of capacitor column segments comprises a first capacitor column segment laterally offset from a second capacitor column segment; and a first conductive contact extending through the capacitor dielectric layers and the conductive layers to contact a conductive pillar structure of the first capacitor column segment. In an embodiment, the first capacitor column segment is directly laterally adjacent to the second capacitor column segment, wherein a lateral distance between the first and second capacitor column segments is less than half of a width of the first capacitor column segment. In an embodiment, the lateral distance is less than a thickness of a topmost capacitor dielectric layer along a peripheral region of the first capacitor column segment. In an embodiment, the lateral distance is less than a thickness of the conductive layers and the capacitor dielectric layers of the first capacitor column segment disposed along a sidewall of the conductive pillar structure of the first capacitor column segment. In an embodiment, the first conductive contact is directly electrically coupled to the conductive base layer by way of the conductive pillar structure of the first capacitor column segment. In an embodiment, a width of the first conductive contact is equal to or less than a width of the conductive pillar structure of the first capacitor column segment. In an embodiment, the integrated chip further includes a second conductive contact overlying the second capacitor column segment, wherein the second conductive contact directly contacts an individual conductive layer of the second capacitor column segment, wherein a width of the second conductive contact is different from a width of the first conductive contact. In an embodiment, the integrated chip further includes a sidewall spacer structure laterally disposed around sidewalls of the first conductive contact, wherein the sidewall spacer structure separates the first conductive contact from the conductive layers of the first capacitor column segment.

In some embodiments, the present application provides a method for forming an integrated chip, including: depositing a conductive base layer over a semiconductor substrate; forming a plurality of conductive pillar structures over the conductive base layer; forming a plurality of capacitor dielectric layers and a plurality of conductive layers over and around the conductive pillar structures, wherein the conductive layers are respectively disposed between adjacent capacitor dielectric layers in the plurality of capacitor dielectric layers, wherein a topmost capacitor dielectric layer comprises sidewalls defining a plurality of cavities respectively spaced between diagonally opposite conductive pillar structures; and forming a capping layer over the plurality of capacitor dielectric layers, wherein the capping layer seals the plurality of cavities. In an embodiment, forming the plurality of conductive pillar structures includes: depositing a dielectric layer over the conductive base layer; patterning the dielectric layer to form a plurality of pillar openings in the dielectric layer; depositing a conductive material within the plurality of pillar openings; and removing the dielectric layer. In an embodiment, when viewed from above the conductive pillar structures are circular, wherein the conductive layers respectively comprise a ring-shaped segment concentric with each conductive pillar structure. In an embodiment, the plurality of conductive pillar structures are formed before forming the plurality of capacitor dielectric layers and the plurality of conductive layers, wherein forming the plurality of capacitor dielectric layers and the plurality of conductive layers includes: conformally depositing a first capacitor dielectric layer on top surfaces and sidewalls of the conductive pillar structures; conformally depositing a first conductive layer on the first capacitor dielectric layer; conformally depositing a second capacitor dielectric layer on the first conductive layer; conformally depositing a second conductive layer on the second capacitor dielectric layer; and conformally depositing the topmost capacitor dielectric layer over the second conductive layer, wherein a thickness of the topmost capacitor dielectric layer is greater than a thickness of the first capacitor dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, comprising:
depositing a conductive base layer over a semiconductor substrate;
forming a plurality of conductive pillar structures over the conductive base layer;
forming a plurality of capacitor dielectric layers and a plurality of conductive layers over and around the conductive pillar structures, wherein the conductive layers are respectively disposed between adjacent capacitor dielectric layers in the plurality of capacitor dielectric layers, wherein a topmost capacitor dielectric layer comprises sidewalls defining a plurality of cavities respectively spaced between diagonally opposite conductive pillar structures; and
forming a capping layer over the plurality of capacitor dielectric layers, wherein the capping layer seals the plurality of cavities.

2. The method of claim 1, wherein forming the plurality of conductive pillar structures comprises:
depositing a dielectric layer over the conductive base layer;
patterning the dielectric layer to form a plurality of pillar openings in the dielectric layer;
depositing a conductive material within the plurality of pillar openings; and
removing the dielectric layer.

3. The method of claim 1, wherein when viewed from above the conductive pillar structures are circular, wherein the conductive layers respectively comprise a ring-shaped segment concentric with each conductive pillar structure.

4. The method of claim 1, wherein the plurality of conductive pillar structures are formed before forming the plurality of capacitor dielectric layers and the plurality of conductive layers, wherein forming the plurality of capacitor dielectric layers and the plurality of conductive layers comprises:
conformally depositing a first capacitor dielectric layer on top surfaces and sidewalls of the conductive pillar structures;
conformally depositing a first conductive layer on the first capacitor dielectric layer;
conformally depositing a second capacitor dielectric layer on the first conductive layer;
conformally depositing a second conductive layer on the second capacitor dielectric layer; and
conformally depositing the topmost capacitor dielectric layer over the second conductive layer, wherein a thickness of the topmost capacitor dielectric layer is greater than a thickness of the first capacitor dielectric layer.

5. The method of claim 1, wherein the plurality of capacitor dielectric layers comprises a first capacitor dielectric layer having a bottom surface aligned with a bottom surface of the plurality of conductive pillar structures.

6. The method of claim 1, wherein the conductive base layer and the plurality of conductive pillar structures comprise a first material and the plurality of conductive layers comprise a second material different from the first material.

7. The method of claim 1, wherein a width of a first conductive pillar structure in the plurality of conductive pillar structures is greater than a thickness of the conductive base layer.

8. The method of claim 1, further comprising:
forming a first conductive contact on a first conductive pillar structure in the plurality of conductive pillar structures, wherein the first conductive contact extends through the capping layer, the plurality of capacitor dielectric layers, and the plurality of conductive layers; and
forming a second conductive contact on a first conductive layer in the plurality of conductive layers, wherein the second conductive contact extends through the capping layer and the topmost capacitor dielectric layer.

9. The method of claim 8, further comprising:
forming a first sidewall spacer around the first conductive contact and a second sidewall spacer around the second conductive contact, wherein the first sidewall spacer laterally spaces the first conductive contact from the plurality of conductive layers.

10. The method of claim 9, wherein a top surface of the first sidewall spacer is aligned with a top surface of the first conductive contact.

11. A method for forming an integrated chip, comprising:
depositing a conductive base layer over a semiconductor substrate;
depositing a first dielectric layer over the conductive base layer;
performing an etching process on the first dielectric layer to form a plurality of openings in the first dielectric layer, wherein the plurality of openings expose a top surface of the conductive base layer;
forming a plurality of conductive pillar structures in the plurality of openings and on the conductive base layer;
removing the first dielectric layer; and
forming a plurality of capacitor dielectric layers and a plurality of conductive layers over and around the plurality of conductive pillar structures, wherein adjacent conductive layers in the plurality of conductive layers are separated by a corresponding capacitor dielectric layer in the plurality of capacitor dielectric layers, wherein a bottommost capacitor dielectric layer of the plurality of capacitor dielectric layers contacts sidewalls and top surfaces of the conductive pillar structures, wherein the bottommost capacitor dielectric layer is spaced between the plurality of conductive pillar structures and a bottommost conductive layer of the plurality of conductive layers.

12. The method of claim 11, wherein forming the plurality of conductive pillar structures comprises:
depositing a conductive material in the plurality of openings and over the first dielectric layer; and
performing a planarization process on the conductive material.

13. The method of claim 11, wherein the conductive pillar structures are formed in the plurality of openings by chemical vapor deposition or electroplating.

14. The method of claim 11, further comprising:
depositing a capping layer over the plurality of capacitor dielectric layers forming a masking layer over the capping layer;
performing a first etch on the capping layer and a first capacitor dielectric layer in the plurality of capacitor dielectric layers, wherein the first etch forms a first contact opening over a first conductive pillar structure in the plurality of conductive pillar structures and a second contact opening over a second conductive pillar structure in the plurality of conductive pillar structures;

forming a first masking segment in the first contact opening;

performing a second etch on the plurality of capacitor dielectric layers and the plurality of conductive layers to expand the second contact opening;

removing the masking layer and the first masking segment; and forming a first conductive contact in the first contact opening and a second conductive contact in the second contact opening.

15. The method of claim 14, further comprising:

forming a first sidewall spacer lining the first contact opening and a second sidewall spacer lining the second contact opening, wherein the second sidewall spacer contacts a top surface of the second conductive pillar structure.

16. The method of claim 14, further comprising:

forming a first conductive wire over the first conductive contact and a second conductive wire over the second conductive contact.

17. A method for forming an integrated chip, comprising:

depositing a conductive base layer over a semiconductor substrate;

forming a plurality of conductive pillar structures on the conductive base layer, wherein the conductive base layer and the plurality of conductive pillar structures comprise a first material, wherein in a top view the conductive pillar structures are arranged in an array comprising a plurality of columns and a plurality of rows;

depositing a first capacitor dielectric layer over and around the plurality of conductive pillar structures;

depositing a first conductive layer over the first capacitor dielectric layer;

depositing a second capacitor dielectric layer over the first conductive layer;

depositing a second conductive layer over the second capacitor dielectric layer, wherein the first conductive layer and the second conductive layer continuously laterally wrap around each conductive pillar structure in the plurality of conductive pillar structures; and depositing a third capacitor dielectric layer over the second conductive layer, wherein in the top view the third capacitor dielectric layer comprises a plurality of sidewalls forming a plurality of cavities spaced between adjacent rows of the plurality of rows, wherein a width of a first cavity in the plurality of cavities is less than a width of a first conductive pillar structure in the plurality of conductive pillar structures.

18. The method of claim 17, wherein a top of the first cavity is arranged above a top surface of the first conductive pillar structure.

19. The method of claim 17, wherein a thickness of the first conductive layer is less than the width of the first conductive pillar structure.

20. The method of claim 17, wherein the plurality of conductive pillar structures are formed by a chemical vapor deposition process or an electroplating process and the first conductive layer is deposited by an atomic layer deposition process.

* * * * *